United States Patent
Wang

(10) Patent No.: US 8,367,428 B2
(45) Date of Patent: Feb. 5, 2013

(54) SEMICONDUCTOR DEVICE AND MANUFACTURING METHOD THEREOF

(75) Inventor: Wensheng Wang, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/343,195

(22) Filed: Jan. 4, 2012

(65) Prior Publication Data

US 2012/0107963 A1    May 3, 2012

Related U.S. Application Data

(62) Division of application No. 12/818,279, filed on Jun. 18, 2010, now Pat. No. 8,110,411, which is a division of application No. 11/938,958, filed on Nov. 13, 2007, now Pat. No. 7,763,921.

(30) Foreign Application Priority Data

Nov. 14, 2006 (JP) .................................. 2006-308159

(51) Int. Cl.
 *H01L 21/02* (2006.01)
(52) U.S. Cl. ............ 438/3; 438/239; 438/381; 438/650; 257/295; 257/310; 257/E21.006
(58) Field of Classification Search .................. 257/751, 257/E21.001, E23.01, 305, 306, 295; 438/3, 438/6
See application file for complete search history.

(56) References Cited

U.S. PATENT DOCUMENTS

| | | | |
|---|---|---|---|
| 5,508,953 A | 4/1996 | Fukuda et al. | |
| 6,713,808 B2 | 3/2004 | Wang et al. | |
| 6,803,617 B2 | 10/2004 | Baniecki et al. | |
| 6,933,156 B2 | 8/2005 | Wang et al. | |
| 7,148,530 B2 | 12/2006 | Shin et al. | |
| 7,176,132 B2 | 2/2007 | Sashida et al. | |
| 2002/0196654 A1 | 12/2002 | Mitarai et al. | |
| 2003/0143853 A1 | 7/2003 | Celii et al. | |
| 2006/0216954 A1 | 9/2006 | Wang | |
| 2006/0231880 A1 | 10/2006 | Yamakawa et al. | |
| 2006/0261388 A1 | 11/2006 | Shin et al. | |
| 2007/0114594 A1 | 5/2007 | Ono | |

FOREIGN PATENT DOCUMENTS

| | | |
|---|---|---|
| JP | 06-326270 A | 11/1994 |
| JP | 8-288239 A | 11/1996 |
| JP | 2002-57301 A | 2/2002 |
| JP | 2002-368200 A | 12/2002 |
| JP | 2003-51582 A | 2/2003 |

(Continued)

OTHER PUBLICATIONS

Japanese Office Action issued in corresponding Patent Application No. 2006-308159, mailing date May 1, 2012 (w/ partial translation).

(Continued)

*Primary Examiner* — Mamadou Diallo
(74) *Attorney, Agent, or Firm* — Westerman, Hattori, Daniels & Adrian, LLP

(57) ABSTRACT

The present invention provides a semiconductor device which is characterized as follows. The semiconductor device includes: an interlayer insulating film formed above a semiconductor substrate and provided with a hole above an impurity diffusion region; a conductive plug formed in the hole and electrically connected to the impurity diffusion region; a conductive oxygen barrier film formed on the conductive plug and the interlayer insulating film around the conductive plug; a conductive anti-diffusion film formed on the conductive oxygen barrier film; and a capacitor that has a lower electrode which is formed on the conductive anti-diffusion film and which exposes platinum or palladium on the upper surface, a capacitor dielectric film made of a ferroelectric material, and an upper electrode. The conductive anti-diffusion film is made of a non-oxide conductive material for preventing the diffusion of the constituent element of the capacitor dielectric film.

9 Claims, 32 Drawing Sheets

FOREIGN PATENT DOCUMENTS

| | | |
|---|---|---|
| JP | 2003-092391 A | 3/2003 |
| JP | 2003-209179 A | 7/2003 |
| JP | 2003-318371 A | 11/2003 |
| JP | 2004-153006 A | 5/2004 |
| JP | 2004-153031 A | 5/2004 |
| JP | 2004-241756 A | 8/2004 |
| JP | 2006-135127 A | 5/2006 |
| JP | 2006-147632 A | 6/2006 |
| JP | 2006-253194 A | 9/2006 |

OTHER PUBLICATIONS

Japanese Office Action dated Aug. 28, 2012, issued in corresponding Japanese Patent Application No. 2006-308159, (4 pages). With English Translation.

SEMICONDUCTOR DEVICE AND MANUFACTURING METHOD THEREOF

CROSS-REFERENCE TO RELATED APPLICATIONS

This application is a divisional application of U.S. application Ser. No. 12/818,279, filed Jun. 18, 2010, which is a divisional application of U.S. application Ser. No. 11/938,958, filed Nov. 13, 2007, which is now U.S. Pat. No. 7,763,921, issued Jul. 27, 2010, which is based on and claims priority of Japanese Patent Application No. 2006-308159 filed on Nov. 14, 2006, the entire contents of which are incorporated herein by reference.

TECHNICAL FIELD

The present invention relates to a semiconductor device and a manufacturing method thereof.

BACKGROUND

Recently, along with advances in digital technologies, developments of non-volatile memories capable of saving a large volume of data at high rate are in progress.

A flash memory and a ferroelectric memory are known as such non-volatile memories.

Among them, a flash memory is provided with a floating gate buried in a gate insulating film of an insulated gate field effect transistor (IGFET), and is configured to store information by accumulating charges representing stored information in this floating gate. However, such a flash memory has a drawback that it is necessary to apply a tunnel current, which requires a relatively high voltage, to the gate insulating film at the time of writing or erasing information.

In contrast, a ferroelectric memory, called also as a FeRAM (which stands for a ferroelectric random access memory), is configured to store information by utilizing a hysteresis property of a ferroelectric film included in a ferroelectric capacitor. The ferroelectric film causes polarization depending on a voltage applied between an upper electrode and a lower electrode of the capacitor, and spontaneous polarization remains after the voltage is discontinued. This spontaneous polarization is reversed when the polarity of the applied voltage is reversed. The information is written in the ferroelectric film by causing the directions of the spontaneous polarization to correspond respectively to "1" and "0". The voltage required for writing the information therein is lower than the voltage used in the flash memory. Moreover, the FeRAM has another advantage that it is possible to write the information at a higher speed than that of the flash memory. By utilizing these advantages, an embedded chip, called a system-on-chip (SOC), formed by combining a FeRAM and a logic circuit is now being examined for use in an IC card, for example.

Here, the crystalline orientation of the lower electrode of the ferroelectric capacitor has a large impact on the ferroelectric properties of a capacitor dielectric film such as an amount of residual polarization charges. For this reason, in order to obtain a ferroelectric capacitor having excellent electric properties, it is essential to control the crystalline orientation of the lower electrode so as to improve the crystallinity thereof.

For example, the paragraph 0131 in Japanese Patent Application Laid-open Publication No. 2003-92391 (JP-A 2003-92391) discloses the technique to use the laminated film as the lower electrode, which is configured by forming an iridium film, an iridium oxide film, a platinum film, a platinum oxide film and another platinum film in this order. JP-A 2003-92391 discloses that it is possible to increase integrated intensity of the (111) orientation of the uppermost platinum film by forming the platinum film in the middle of the laminated film in this manner.

The lowermost iridium film has a function as an antioxidant film for the tungsten plug located therebelow. Here, it is necessary to form the iridium film with a thickness of at least 200 nm in order to prevent oxidation of the tungsten plug effectively. Consequently, this technique has a difficulty of patterning the lower electrode by etching.

Meanwhile, the paragraph 0027 in JP-A 2004-153006 discloses the same lower electrode structure as that in JP-A 2003-92391, which has the same problem as described above.

Moreover, the paragraph 0051 in JP-A 2003-318371 discloses the technique to form a lower electrode configured of a single-layer film or laminated-layer film of a combination of an iridium film, an iridium oxide film, a platinum film, a palladium film, a palladium oxide film, or a gold film.

Meanwhile, JP-A 2003-209179 discloses the technique to form an adhesive layer below a lower electrode. The adhesive layer may include a titanium oxide film, a platinum film, an iridium film, a zirconium film, a titanium film, a platinum oxide film, an iridium oxide film, a zirconium oxide film, a titanium nitride film, a titanium aluminum nitride (TiAlN) film or the like (the paragraph 0087).

Moreover, JP-A 2003-51582 discloses the technique to form a barrier layer made of an aluminum-iridium alloy on a plug, and then to form a platinum film as the lower electrode on this barrier layer. According to JP-A 2003-51582, the aluminum oxide is formed in platinum crystal grain boundaries inside the platinum film by subjecting this platinum film to thermal treatment, and thereby a barrier characteristic of the barrier layer against oxygen is enhanced (the paragraphs 0031 to 0034).

Meanwhile, JP-A Hei 6 (1994)-326270 discloses the technique to form a tungsten film functioning as a diffusion barrier film below a ferroelectric film made of PZT (lead zirconate titanate: $PbZrTiO_3$) in order to prevent diffusion of lead atoms in the ferroelectric film (the paragraph 0041). However, tungsten is a material which is extremely susceptible to oxidation. Consequently, there is a high risk of abnormal oxidation of the diffusion barrier film in an oxygen atmosphere which leads to contact defects.

JP-A Hei 8 (1996)-288239 focuses on a fact that a platinum film is apt to transmit oxygen therethrough, and discloses the technique to form an oxygen barrier layer made of a titanium film below the lower electrode made of platinum, and thereby oxygen is prevented from diffusing from the platinum film to the substrate (the paragraph 0006).

JP-A 2002-368200 discloses the technique to provide an adhesive layer made of hafnium-containing iridium between a diffusion barrier layer and a lower electrode formed on a contact plug in order to prevent detachment of the lower electrode (the paragraph 0061).

Moreover, JP-A 2002-57301 discloses the technique to form an oxygen barrier layer between a tungsten plug and a lower electrode in the paragraphs 0023 and 0030. The oxygen barrier layer is formed either as the laminated film of a titanium film and a titanium nitride film (the paragraph 0023) or as a titanium aluminum nitride film (the paragraph 0030).

SUMMARY

According to one aspect of the present invention, there is provided a semiconductor device having an impurity diffusion region formed in a semiconductor substrate, an interlayer insulating film formed over the semiconductor substrate and including a hole, a conductive plug formed in the hole and electrically connected to the impurity diffusion region, a conductive oxygen barrier film formed on the conductive plug and on the interlayer insulating film around the conductive plug, a conductive anti-diffusion film formed on the conductive oxygen barrier film, a capacitor including a lower electrode formed on the conductive anti-diffusion film and exposing any of platinum and palladium on an upper surface, a capacitor dielectric film made of a ferroelectric material, and an upper electrode, wherein the conductive anti-diffusion film is made of a non-oxide conductive material for preventing the diffusion of a constituent element of the capacitor dielectric film.

DETAILED DESCRIPTION OF THE EMBODIMENTS (1) Process to Achieve the Invention

The process to achieve the present invention will be explained prior to description of the preferred embodiments of the present invention.

The lead zirconate titanate (PZT) films formed by the sputtering method and the metal-organic chemical vapor deposition (MOCVD) method are typically used as capacitor dielectric films for ferroelectric capacitors. Of those films, the PZT film formed by the MOCVD method has an advantage in terms of higher integration as compared to films obtained by other film formation methods because the film is crystallized at the time of film formation, and thus hardly reduces a switching charge amount Qsw even when the film thickness is reduced.

In the MOCVD method, a silicon substrate is put in a reaction chamber, and is heated up to a predetermined substrate temperature. Some gases are conceivable for the atmosphere in the reaction chamber when raising the temperature.

Nevertheless, it is found out that the crystallinity of the PZT film is substantially degraded when an argon atmosphere is used as the atmosphere. For example, while the largest polarization in a PZT crystal is observed in the (111) direction, the PZT film formed after heated in the argon atmosphere is oriented in the (100) direction or the (101) direction. Such a PZT crystal exhibits a small switching charge amount, and complicates writing or reading information in and out of the memory using such a ferroelectric capacitor.

To avoid such an inconvenience, the present inventor has thought about heating a silicon substrate in an oxygen atmosphere before forming the PZT film.

However, there are two problems as follows in the case of heating the substrate in such an oxygen atmosphere if an iridium film is used as a lower electrode.

Specifically, a first problem is that the directions of the crystalline orientation of the PZT film fluctuate every time when the PZT film is formed.

Figure 1:
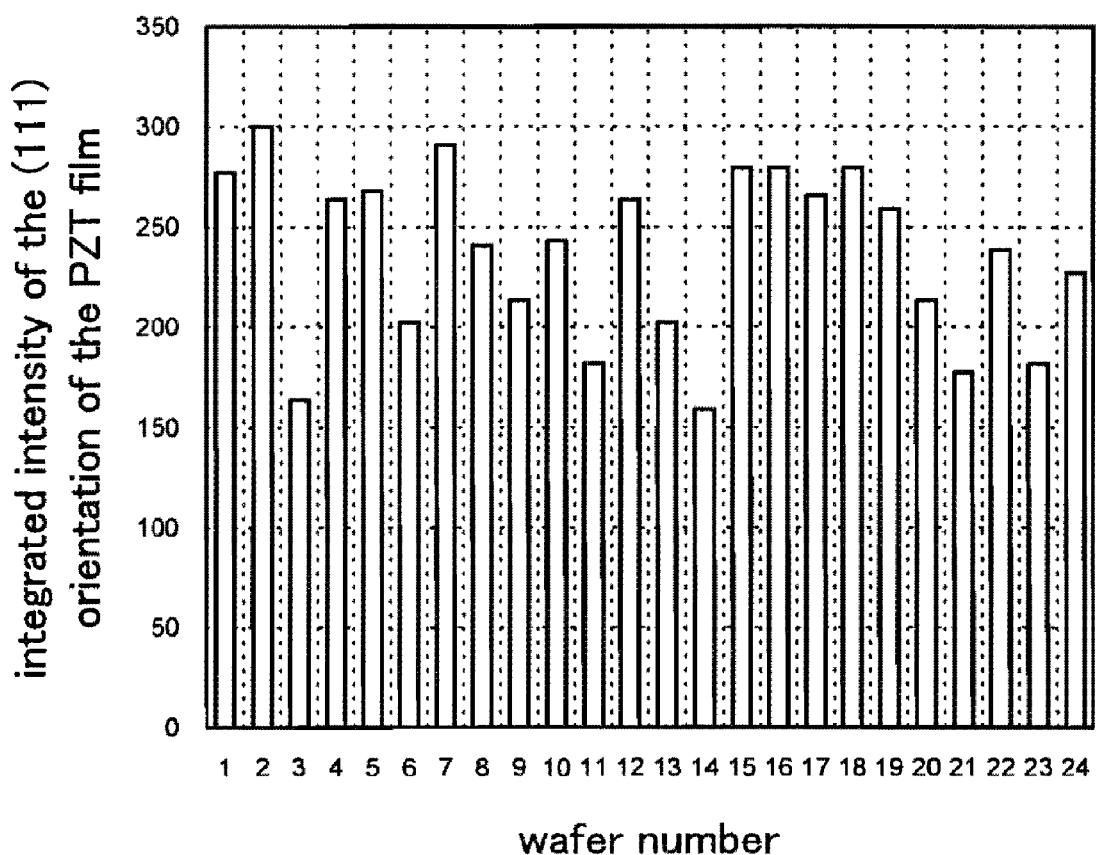
FIG. 1 is a graph showing a relationship obtained by examinations between wafer numbers and integrated intensity of the (111) orientation of lead zirconate titanate (PZT) films.

FIG. 1 is a graph showing a relationship obtained by examinations between silicon wafer numbers and integrated intensity of the (111) orientation of the PZT films. Note that the silicon wafer numbers are arranged in the order of formation of the PZT films (in the processing order).

As shown in FIG. 1, the integrated intensity of the (111) orientation fluctuates widely among the wafers.

Figure 2:
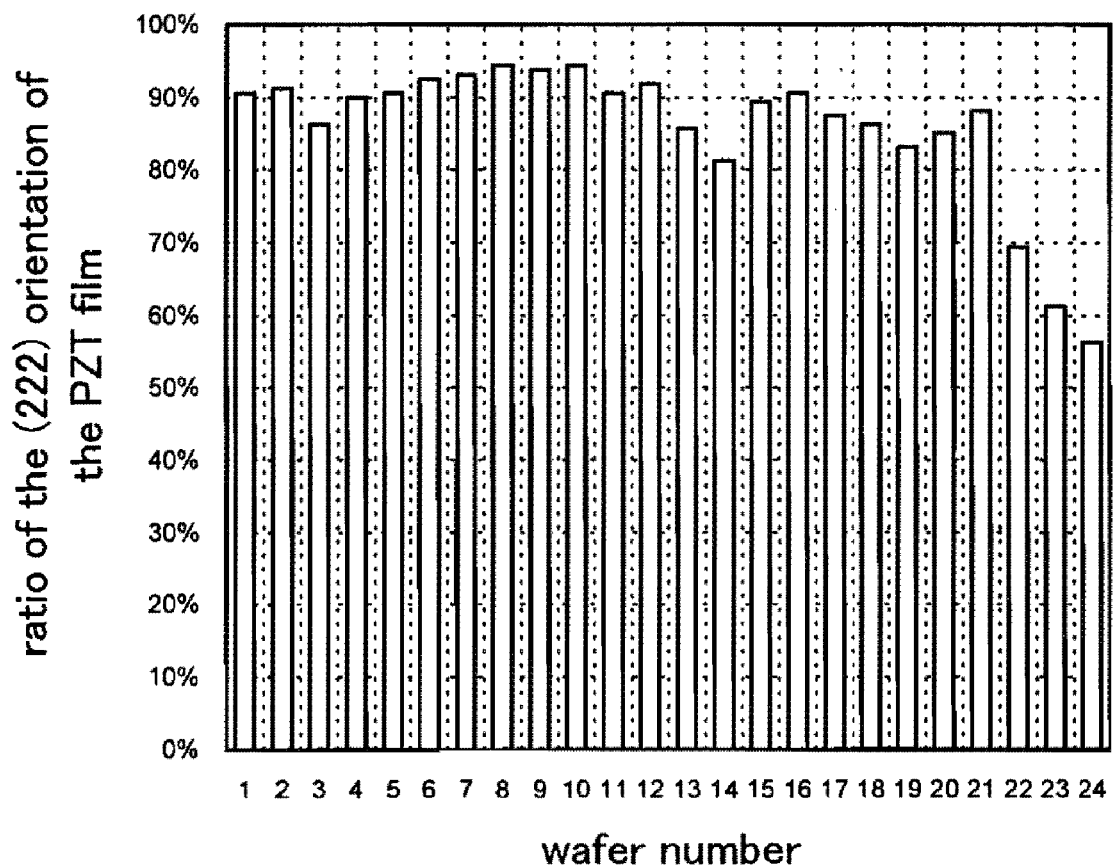
FIG. 2 is a graph showing a relationship obtained by examinations between the wafer numbers and ratio of the (222) orientation of the PZT films.

Meanwhile, FIG. 2 is a graph showing a relationship obtained by examinations between the silicon wafer numbers and ratio of the (222) orientation of the PZT films. Note that the rate of the (222) orientation is defined as $I_{(2,2,2)}/(I_{(1,0,0,)}+I_{(1,0,1)}+I_{(2,2,2)})$, where $I_{(nx,ny,nz)}$ denotes the integrated intensity in the $(n_x, n_y, n_z)$ direction.

As shown in FIG. 2, the ratio of the (222) orientation also fluctuate among the wafers.

If the crystalline orientation of the PZT films widely fluctuates among the wafers as shown in FIG. 1 and FIG. 2, it is not possible to mass-produce ferroelectric capacitors having uniform characteristics.

Meanwhile, a second problem in the case of heating the substrate in the oxygen atmosphere is large unevenness that appears on the surface of the PZT film.

Figure 3:
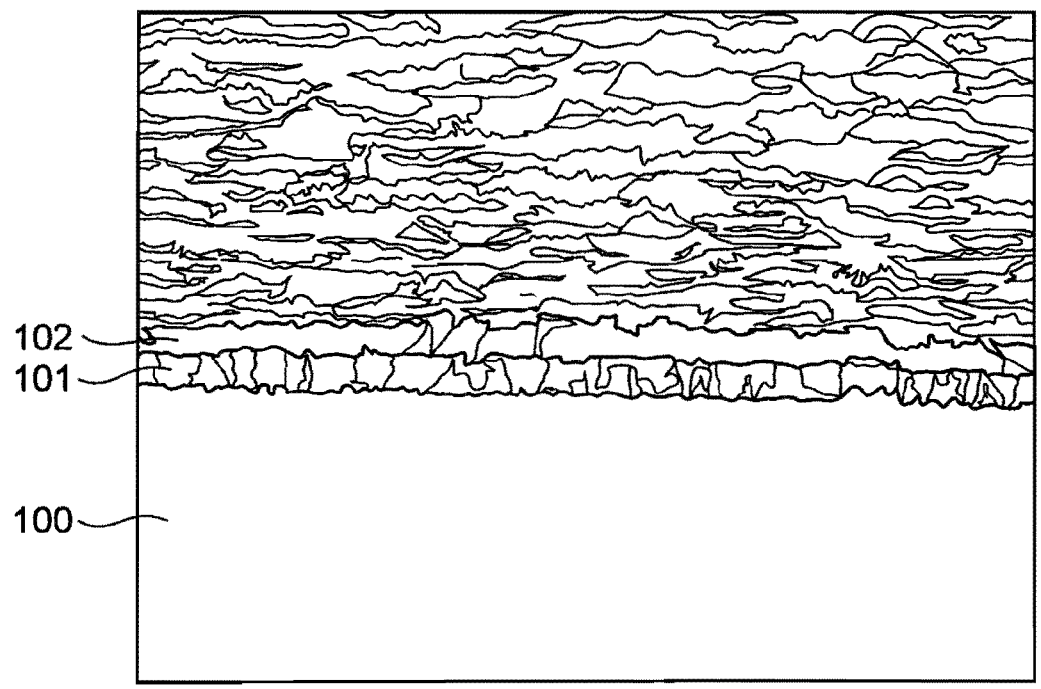
FIG. 3 is an illustration based on a scanning electron microscopic (SEM) image of the PZT film formed on an iridium film after heated in an oxygen atmosphere.

FIG. 3 is an illustration based on a scanning electron microscopic (SEM) image of such a PZT film.

In this example, an iridium film 101 is formed on a silicon substrate 100, and then a PZT film 102 is formed on the iridium film 101 by the MOCVD method.

As shown in the illustration, large unevenness is observed on the surface of the PZT film 102. One of conceivable reasons is that the silicon substrate 100 is heated in the oxygen atmosphere before the PZT film 102 is formed, and consequently a thin iridium oxide layer is formed on the surface of the iridium film 101. The iridium oxide layer returns to original iridium as a result of the reduction reaction by contact with the solvent such as tetrahydrofuran (THF) or butyl acetate supplied at the time of forming the PZT film 102. However, the iridium oxide layer also contains abnormally oxidized iridium oxide which is not reduced by the above-mentioned solvent, and which remains as iridium oxide. As a consequence, the surface of the iridium film 101 includes a heterogeneous phase that makes up of the iridium oxide, resulting in the rough surface of the PZT film 102.

It is conceivable that the fluctuation in the crystalline orientation of the PZT films shown in FIG. 1 and FIG. 2 is also attributed to the abnormal oxidation of the iridium oxide film.

The present inventor has conducted further studies to avoid such problems.

As a result, the present inventor has found out that the problem of the rough surface of the PZT film could be resolved by firstly forming a thin initial layer of the PZT film on the iridium film by the sputtering method or the sol-gel method, and then forming the PZT film on this initial layer by the MOCVD method.

Here, the initial layer of the PZT film formed by the sputtering method or the sol-gel method is not crystallized, and consequently the layer is amorphous immediately after the film formation. Therefore, prior to the formation of the PZT film by the MOCVD method, it is necessary to crystallize the initial layer by subjecting the initial layer to crystallization annealing.

However, it was found out that the crystallinity of the initial layer formed on the iridium film by the sputtering method or the sol-gel method was extremely poorer than the crystallinity of the PZT film formed by the MOCVD method. One of conceivable reasons is that the PZT initial layer is not favorably crystallized by crystallization annealing due to a difference in the lattice constant between iridium and PZT.

To improve the crystallinity of the PZT initial layer, it is effective to constrict a lower electrode from platinum, having a closer lattice constant to that of PZT than iridium, instead of the iridium film, and then to form the PZT initial layer on the lower electrode.

Figure 4:
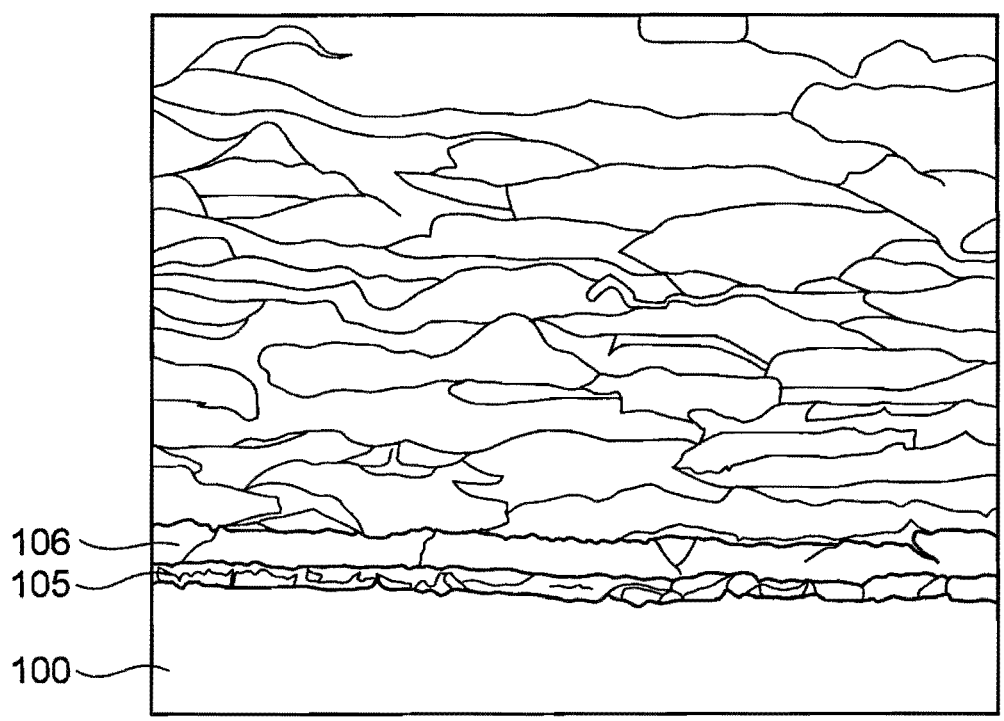
FIG. 4 is an illustration based on a SEM image obtained by forming a PZT initial layer on a platinum film and forming a PZT film thereon by the metal-organic chemical vapor deposition (MOCVD) method.

FIG. 4 is an illustration based on a SEM image obtained by forming a PZT initial layer on a platinum film and forming a PZT film thereon by the MOCVD method.

In this example, a platinum film 105 is formed on a silicon substrate 100. Then, although the PZT initial layer is too thin to observe in the illustration, the PZT initial layer is formed with a thickness of about 30 nm on the platinum film 105 by the sputtering method. Thereafter, a PZT film 106 is formed thereon with a thickness of about 100 nm by the MOCVD method.

As shown in FIG. 4, it is possible to achieve the smooth surface morphology of the PZT film 106 by covering the platinum film 105 with the PZT initial layer.

This is attributed to the fact that the surface of the platinum film 105 is covered with the PZT initial layer and is thus hardly oxidized even when the silicon substrate 100 is heated in the oxygen atmosphere before the PZT film 106 is formed by the MOCVD method. Accordingly, no heterogeneous phase is generated on the surface, except for that of platinum.

Moreover, since the PZT initial layer and the platinum film 106 have mutually close lattice constants, it is also possible to prevent deterioration in the crystallinity of the PZT film 106 associated with lattice mismatch.

On the other hand, the substrate is heated to a high temperature of about 620° C. in the MOCVD method. Accordingly, if the PZT film 106 is formed directly on the platinum film 105, there arises another problem of reduction in the switching charge amount of the PZT film 106 attributable to the reaction between lead atoms in the PZT film 106 and the platinum film 105 caused by the temperature at the time of the film formation.

In contrast, according to the sputtering method, it is possible to form the PZT film at a lower temperature, such as room temperature, than in the MOCVD method. Thus, even when the PZT initial layer is formed by the sputtering method as described above, it is possible to suppress the reaction between the lead and the platinum film 105. Moreover, the PZT initial layer functions as a lead barrier layer when the PZT film 106 is formed by the MOCVD method. Accordingly, it is also possible to suppress the reaction between the lead in the PZT film 106 and the platinum film 105.

Incidentally, ferroelectric random access memories (Fe-RAMs) are broadly categorized into a stack type and a planar type based on their structures.

Of these types, the stack type FeRAM has the structure in which the lower electrode is formed directly on a conductive plug. This FeRAM is formed by patterning the lower electrode, a capacitor dielectric film, and an upper electrode by means of collective etching. Accordingly, this FeRAM has the small area of the capacitor, and is therefore advantageous for higher integration.

Nevertheless, in the case of the stack type FeRAM, it is necessary to form a conductive oxygen barrier film such as a titanium aluminum nitride film between the conductive plug and the lower electrode in order to prevent the oxidation of the conductive plug located immediately below the capacitor.

Figure 5:
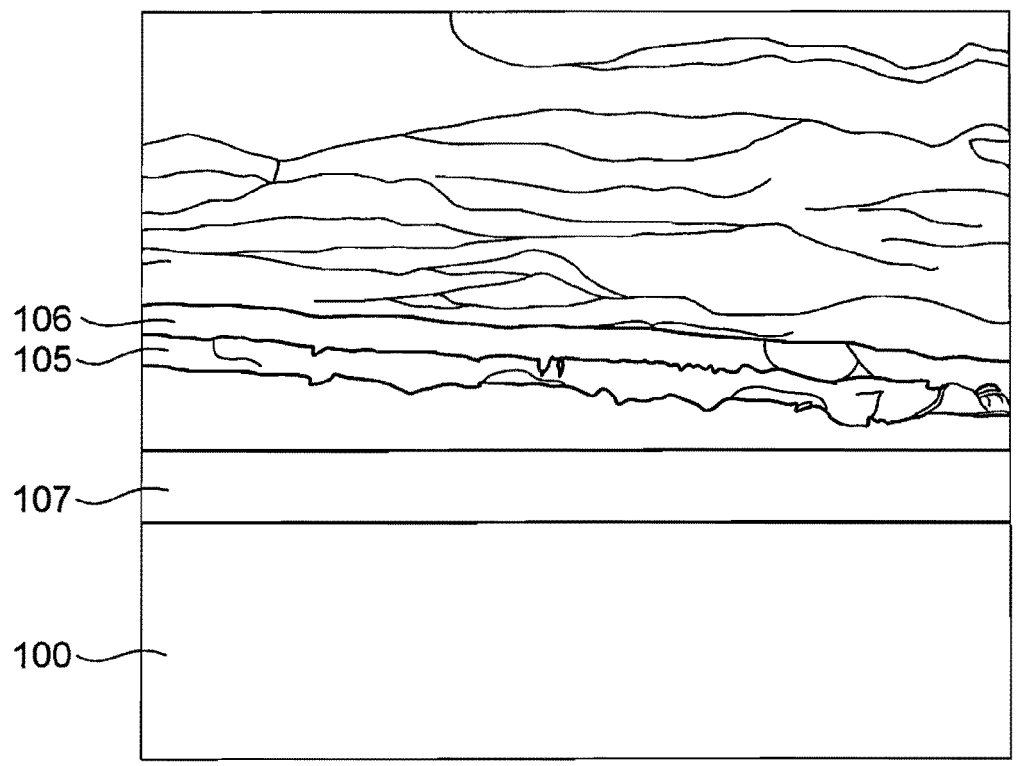
FIG. 5 is an illustration based on a SEM image of the sample obtained by further forming a conductive oxygen barrier film 107 made of titanium aluminum nitride on the structure of FIG. 4.

FIG. 5 is an illustration based on a SEM image of the sample obtained by further forming a conductive oxygen barrier film 107 made of titanium aluminum nitride on the structure of FIG. 4.

As shown in FIG. 5, the platinum film 105 is detached from the conductive oxygen barrier film 107 in this sample. One of conceivable reasons is that the platinum film 105 is apt to transmit lead atoms. Accordingly, the lead atoms in the PZT initial layer are transmitted through the platinum film 105 in the course of subjecting the PZT initial layer to crystallization annealing, whereby lead compounds are formed on an interface between the platinum film 105 and the conductive oxygen barrier film 107.

Note that, in addition to the above-described crystallization annealing process, the annealing process, for example, on the upper electrode may also cause the thermal diffusion of the lead atoms. Although the detachment of the platinum film 105 is observed in this example, there may be another case where the expansion of the platinum film 105 is observed.

The present inventor has contemplated effective measures for preventing the detachment between the conductive barrier film and the lower electrode in the case of using the lead-transmissive film represented by the aforementioned platinum film as the lower electrode and forming the PZT initial layer on the lower electrode. As a consequence, the present inventor has accomplished the embodiments of the present invention described hereinbelow.

(2) First Embodiment

Figure 6A:
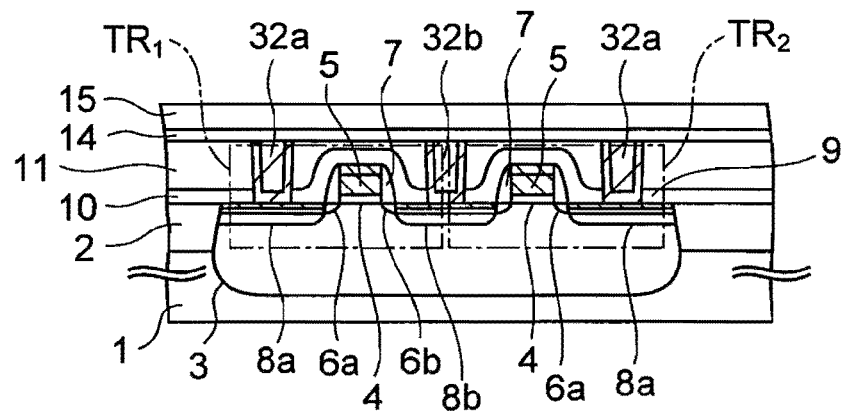
FIGS. 6A to 6X are cross-sectional views showing states in the course of manufacturing a semiconductor device according to a first embodiment of the present invention.
Figure 6B:
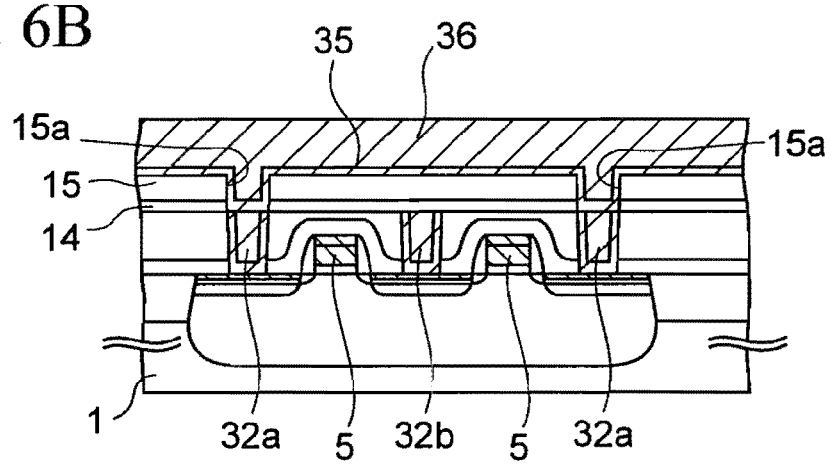
Figure 6C:
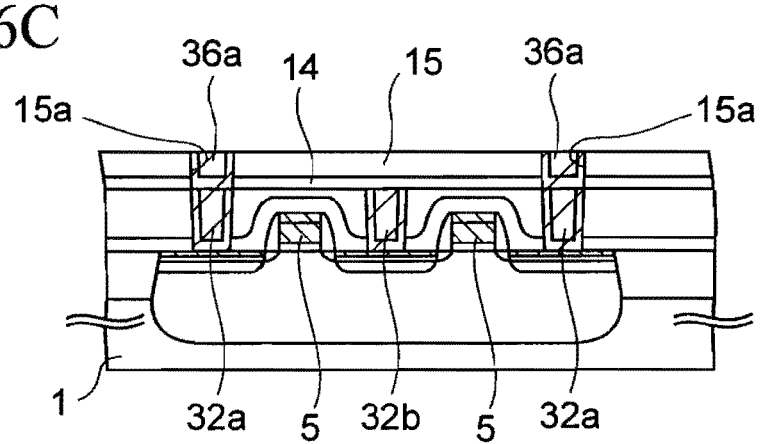
Figure 6D:
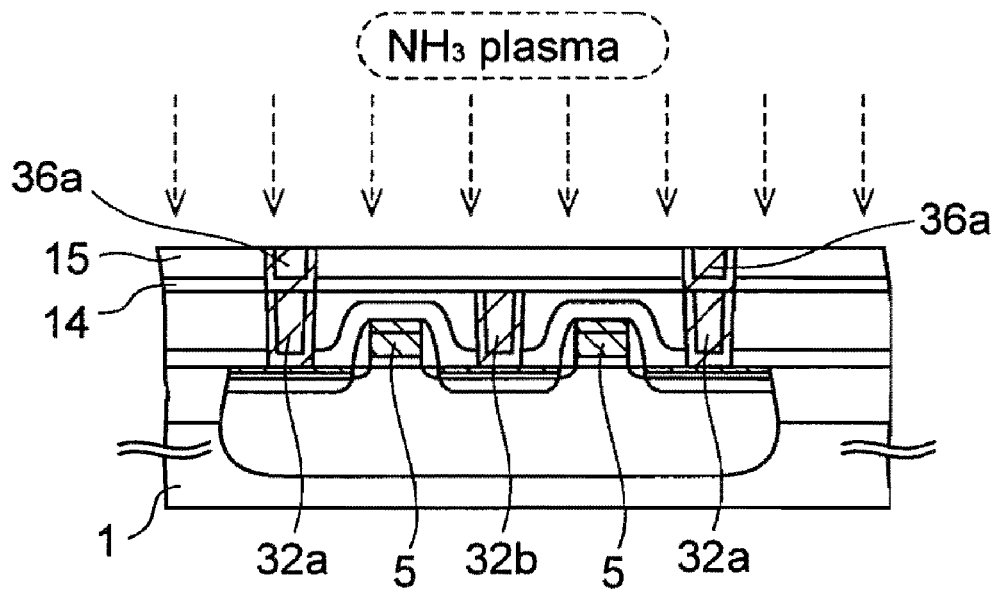
Figure 6E:
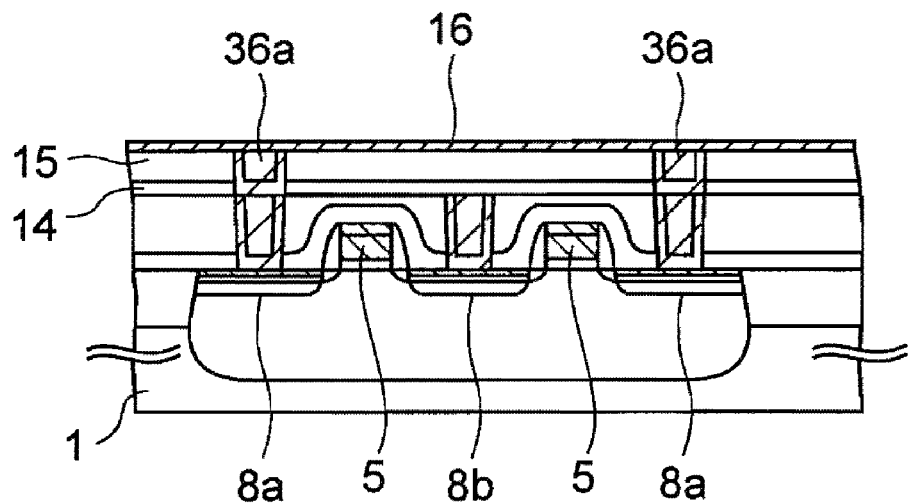
Figure 6F:
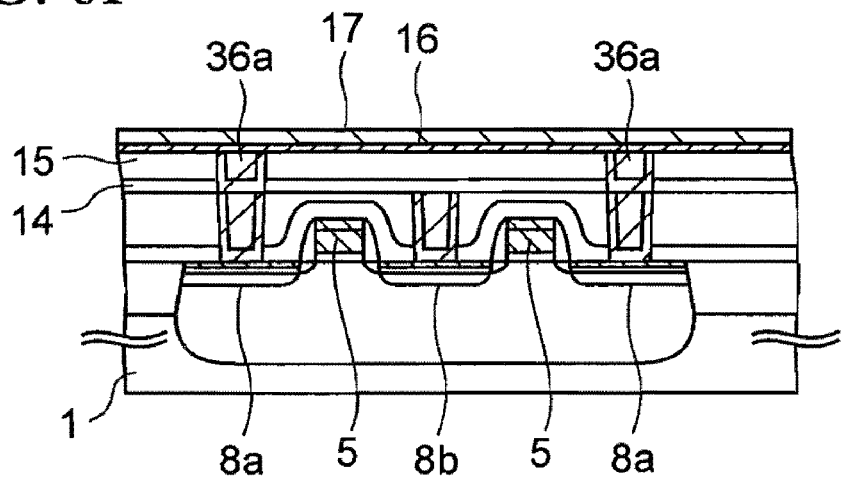
Figure 6G:
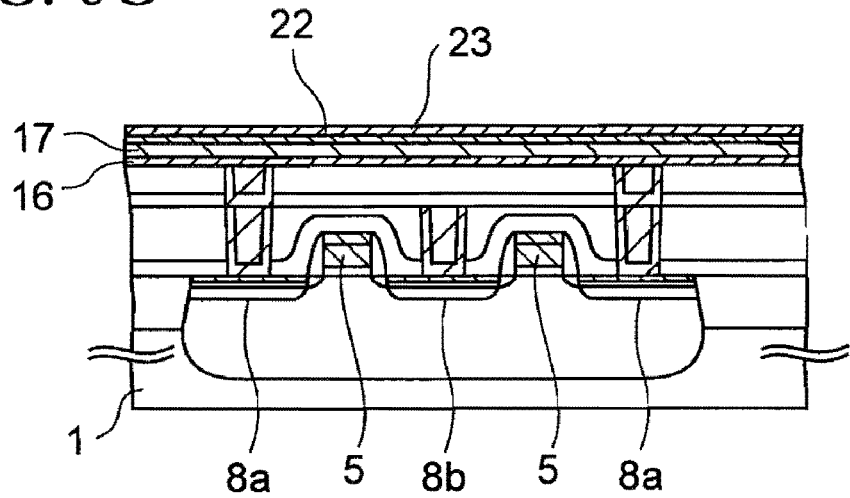
Figure 6H:
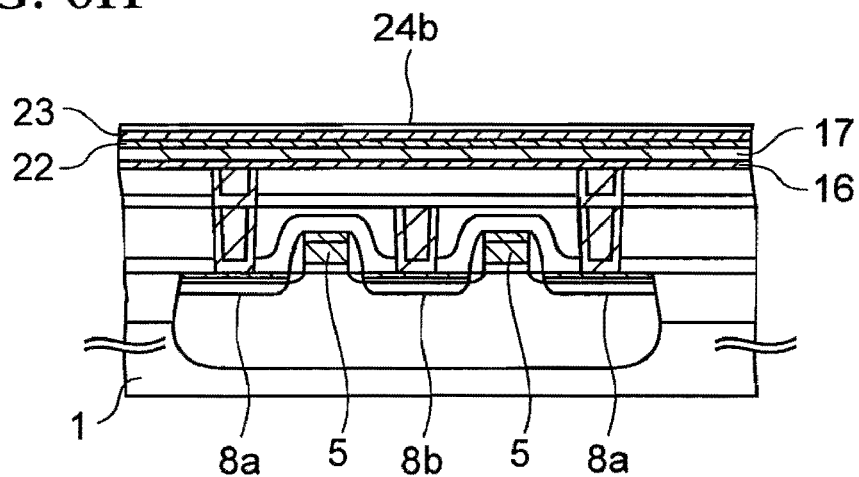
Figure 6I:
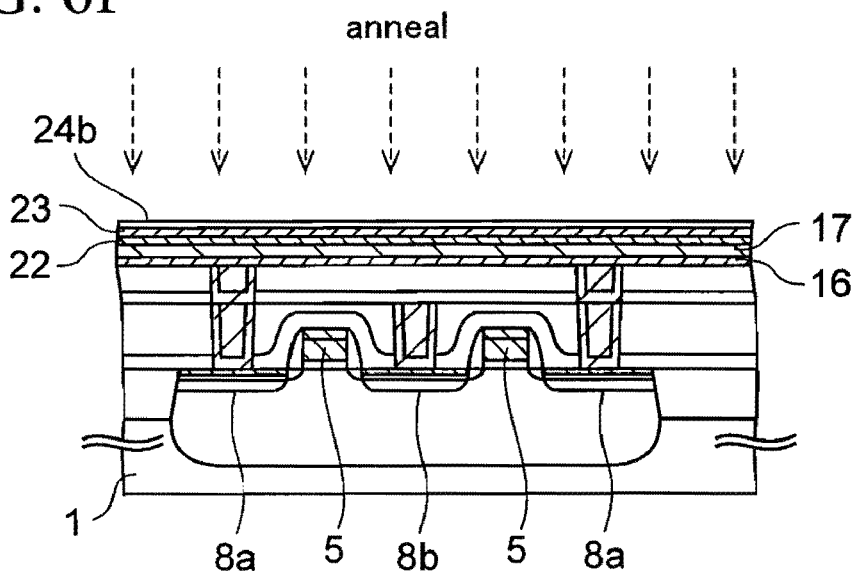
Figure 6J:
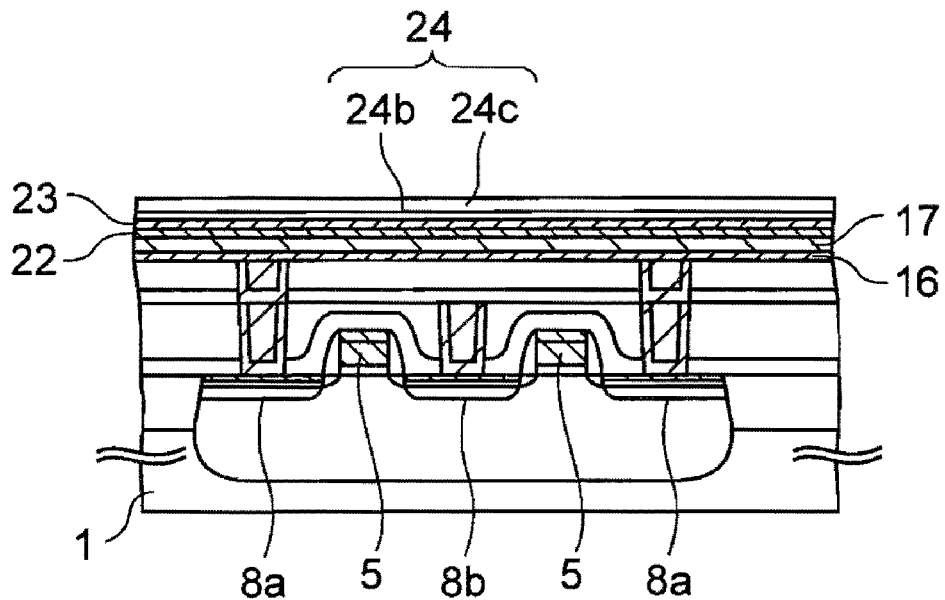
Figure 6K:
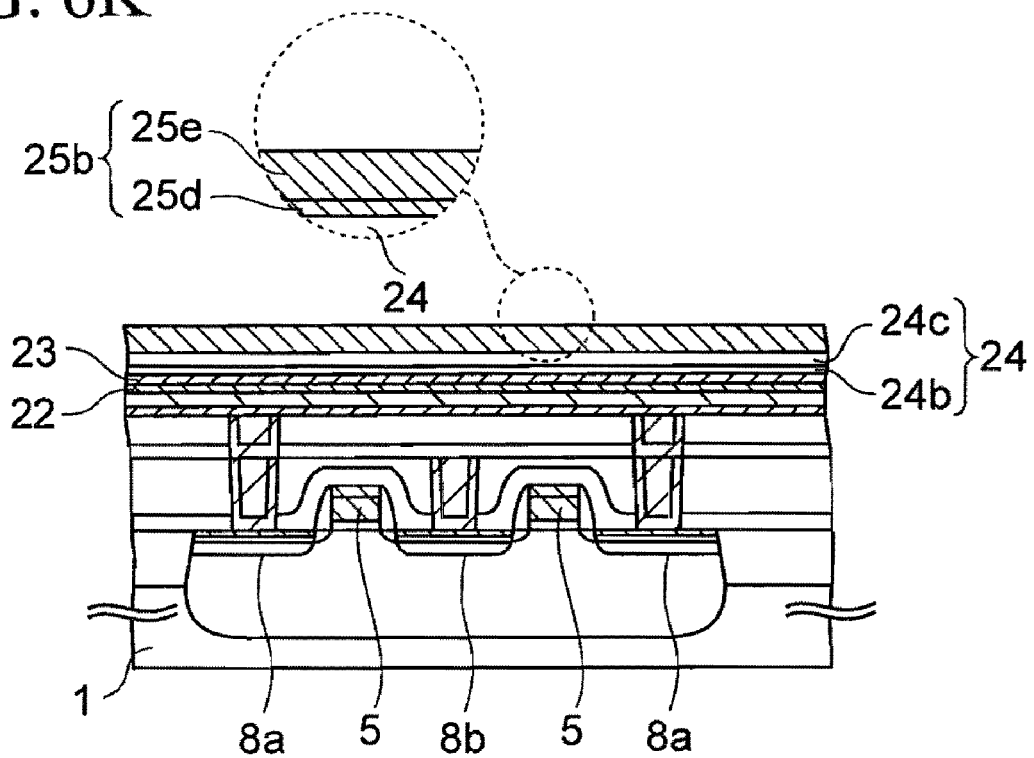
Figure 6L:
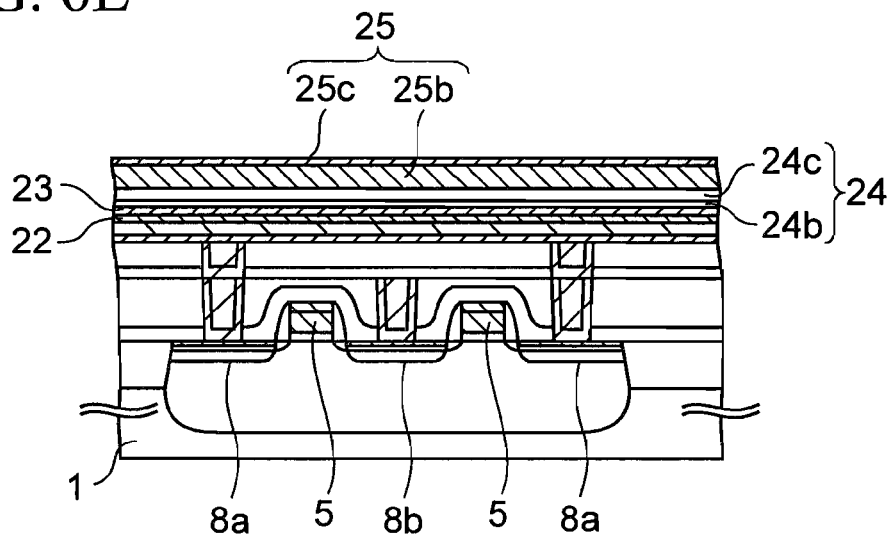
Figure 6M:
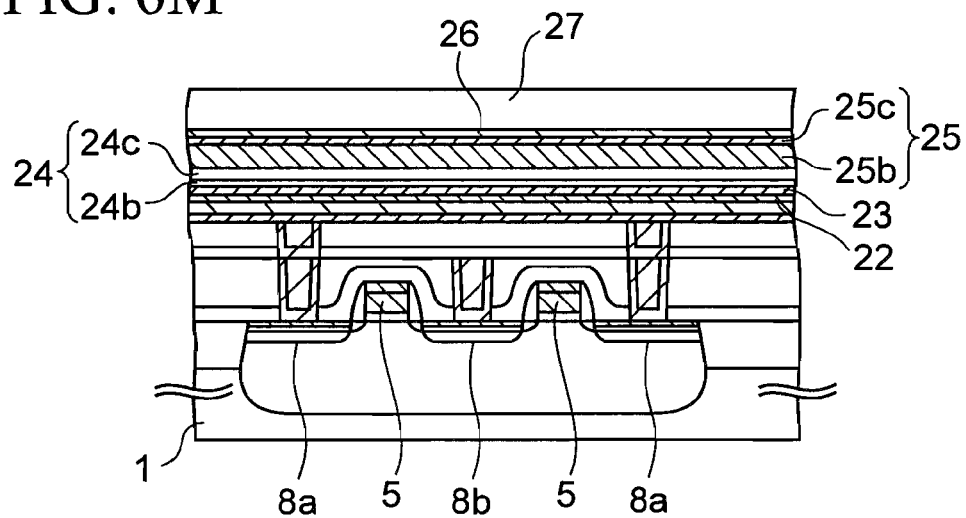
Figure 6N:
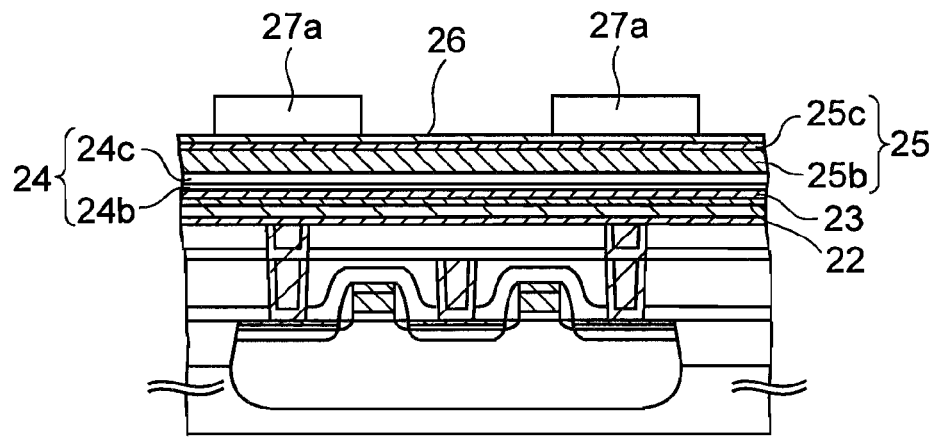
Figure 6O:
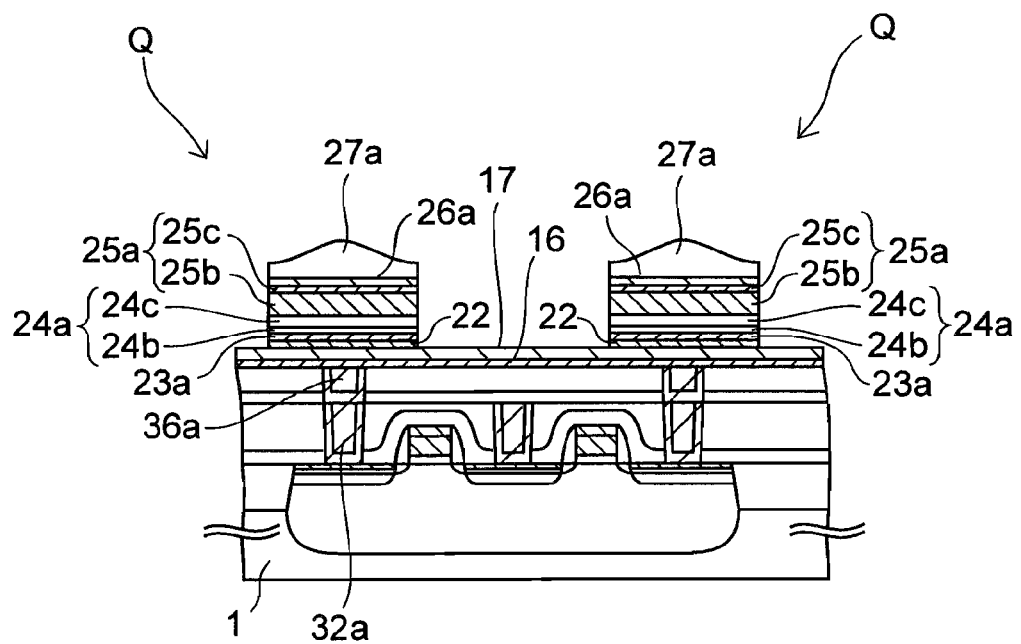
Figure 6P:
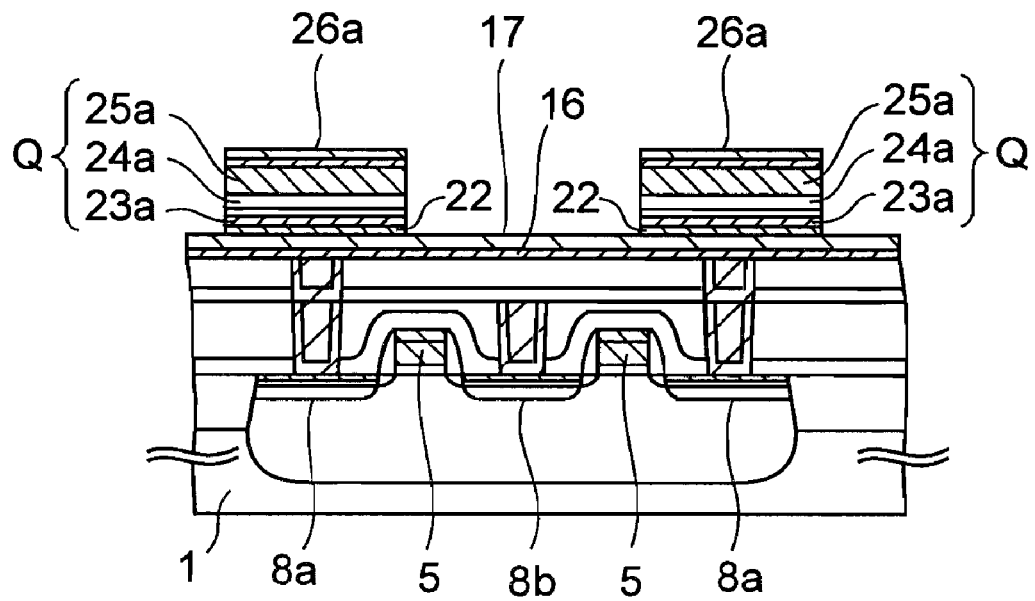
Figure 6Q:
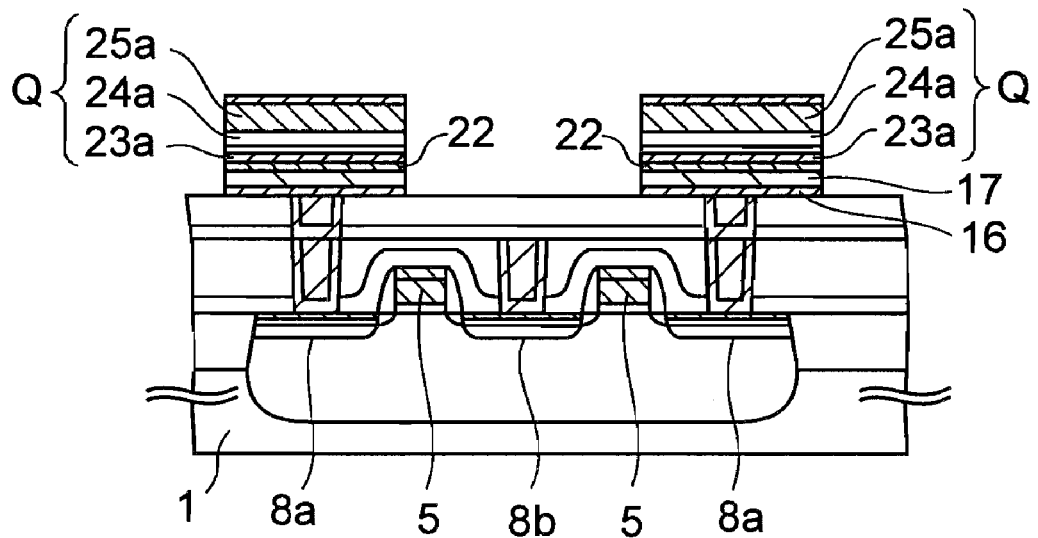
Figure 6R:
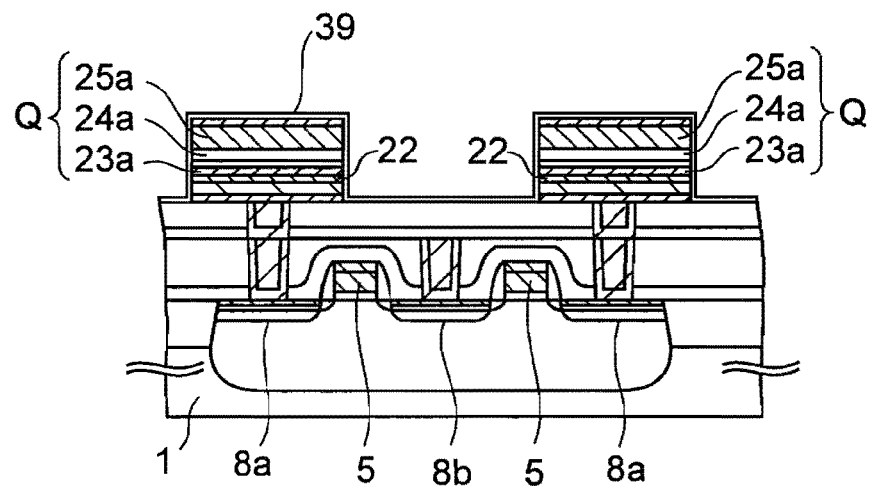
Figure 6S:
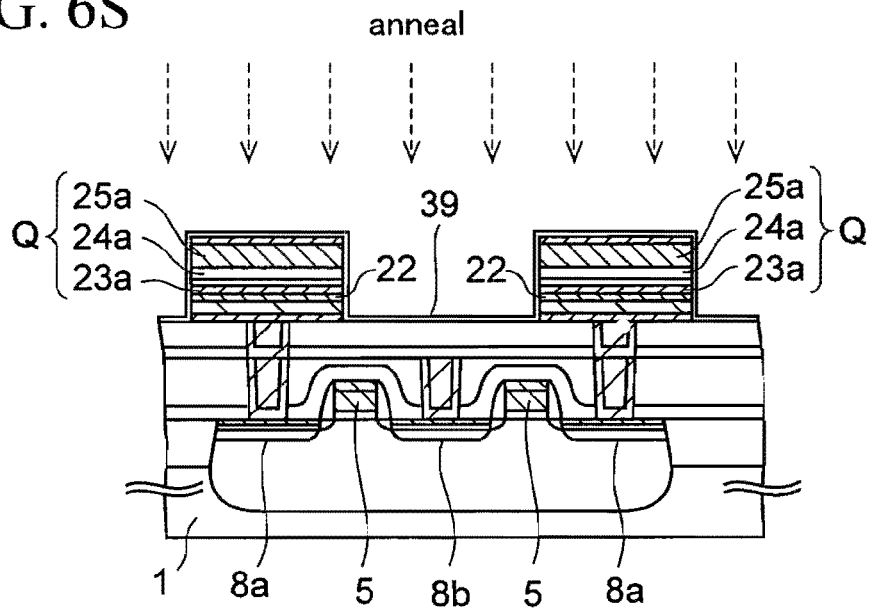
Figure 6T:
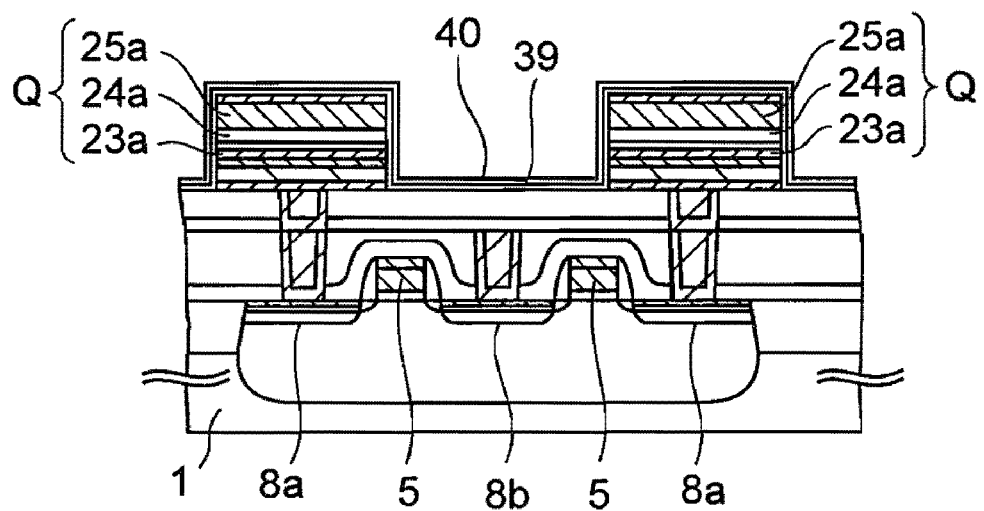
Figure 6U:
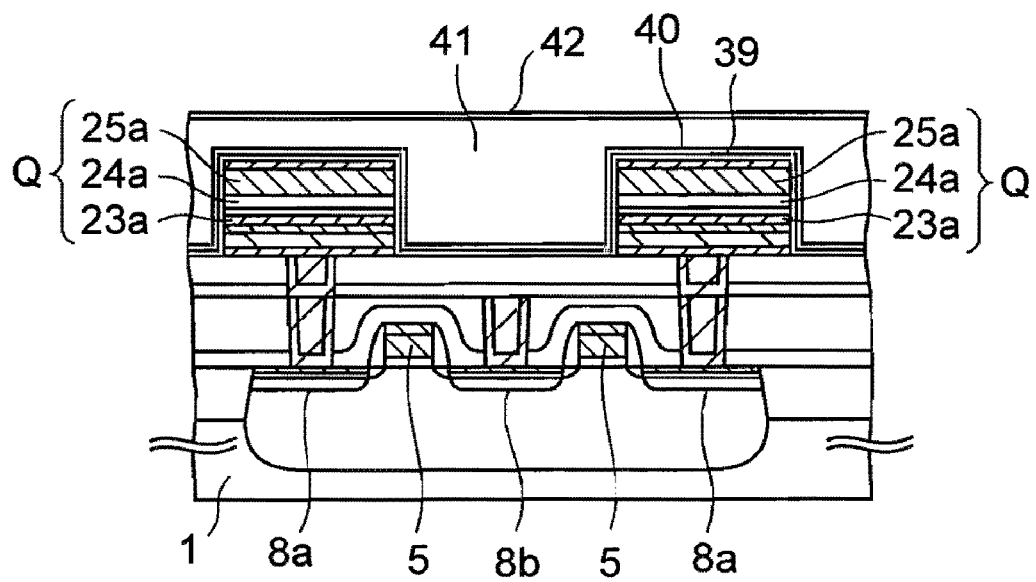
Figure 6V:
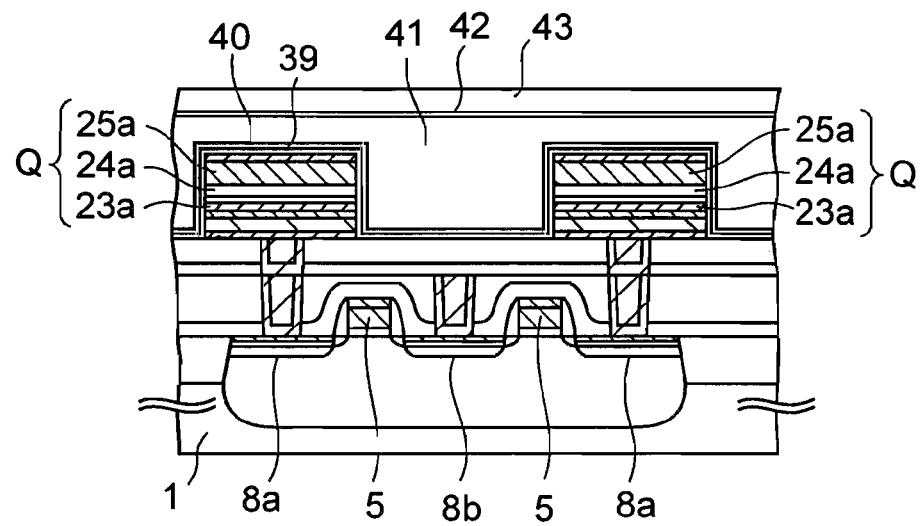
Figure 6W:
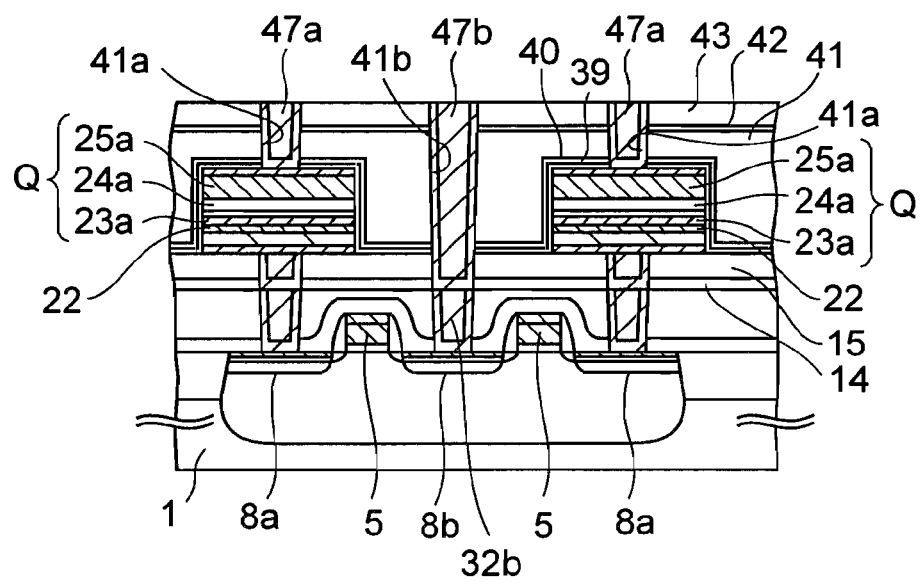
Figure 6X:
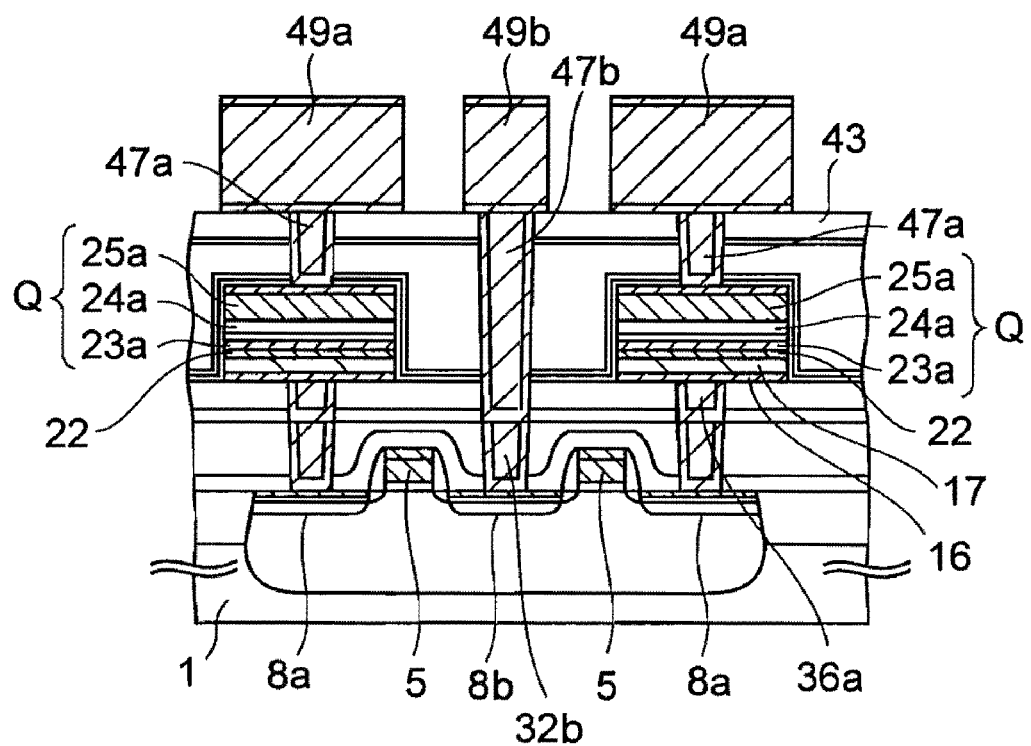

FIGS. 6A to 6X are cross-sectional views showing states in the course of manufacturing a semiconductor device according to a first embodiment.

This semiconductor device is a stack type FeRAM which is advantageous for miniaturization. The semiconductor device is manufactured as described below.

In the beginning, processes to be conducted prior to obtaining a cross-sectional structure shown in FIG. 6A will be described below.

First, a groove for the shallow trench isolation (STI) to define the active region of a transistor is formed in a surface of a silicon (semiconductor) substrate 1 either of an n type or a p type, and an insulating film such as silicon oxide is buried therein to form an element isolation insulating film 2. Note that the element isolation structure is not limited only to the STI. It is also possible to form the element isolation insulating film 2 by the local oxidation of silicon (LOCOS) method instead.

Next, a p-type impurity is doped in the active region of the silicon substrate 1 to form a p-well 3. Then, a thermal oxide film, which is to constitute a gate insulating film 4, is formed by subjecting the surface of the active region to thermal oxidation.

Subsequently, an amorphous or polycrystalline silicon film is formed on the entire upper surface of the silicon substrate 1, and two gate electrodes 5 are formed by patterning these films using photolithography.

The gate electrodes 5 are arranged in parallel on the p-well 3 at a distance from each other. The gate electrodes 5 constitute part of word lines.

Next, an n-type impurity is doped on portions of the silicon substrates 1 beside the gate electrodes 5 by means of ion implantation while the gate electrodes 5 are used as the mask, thereby first and second source/drain extensions 6a and 6b are formed.

Thereafter, an insulating film is formed on the entire upper surface of the silicon substrate 1, and the insulating film is etched back so as to form insulative sidewalls 7 beside the gate electrodes 5. As for the insulating film, a silicon oxide film is formed by the CVD method, for example.

Subsequently, ions of n-type impurity are implanted again into the silicon substrate 1 while the insulative side walls 7 and the gate electrodes 5 are used as the mask, thereby first and second source/drain regions (first and second impurity diffusion regions) 8a and 8b are formed at a distance from each other, on the surface layer of the silicon substrate 1 beside the gate electrodes 5.

By completing these steps, first and second metal oxide silicon (MOS) transistors $TR_1$ and $TR_2$, which include the gate insulating film 4, the gate electrodes 5, and the first and second source/drain regions 8a and 8b, are formed in the active region of the silicon substrate 1.

Next, after a refractory metal layer such as a cobalt layer is formed on the entire upper surface of the silicon substrate 1 by the sputtering method, this refractory metal layer is heated to cause a reaction with silicon. In this way, a refractory metal silicide layer 9 is formed on the silicon substrate 1. The refractory metal silicide layer 9 is also formed on the top layer portion of the gate electrodes 5. Accordingly, resistances of the gate electrodes 5 are reduced.

Thereafter, the unreacted refractory metal layer located above the element isolation insulating film 2, for example, is removed by wet etching.

Subsequently, a silicon nitride (SiN) film is formed with a thickness of about 80 nm on the entire upper surface of the silicon substrate 1 by the plasma CVD method. This SiN film is formed as a cover insulating film 10. Next, a silicon oxide film serving as a first interlayer insulating film 11 is formed with a thickness of about 1000 nm on this cover insulating film 10 by the plasma CVD method using tetraethylorthosilicate (TEOS) gas.

Next, the upper surface of the first interlayer insulating film 11 is polished and planarized by the chemical mechanical polishing (CMP) method. As a result of this CMP process, the thickness of the first interlayer insulating film 11 becomes approximately equal to 700 nm on a flat surface of the silicon substrate 1.

Then, contact holes each having a diameter of 0.25 μm are formed above the first and second source/drain regions 8a and 8b by patterning the cover insulating film 10 and the first interlayer insulating film 11 using the photolithography. In addition, a glue film (an adhesive film) and a tungsten film are sequentially formed inside each of the contact holes, and the excessive glue film and the excessive tungsten film on the first interlayer insulating film 11 are polished and removed by the CMP method. In this way, these films are left only inside the contact holes as first and second conductive plugs 32a and 32b.

These first and second conductive plugs 32a and 32b are electrically connected to the first and second source/drain regions 8a and 8b, respectively.

Note that the glue film is obtained by forming a titanium film with a thickness of about 30 nm and a titanium nitride film with a thickness of about 20 nm in this order. Meanwhile, the tungsten film before the CMP process has a thickness of about 300 nm on the first interlayer insulating film 11.

Here, the first and second conductive plugs 32a and 32b are made mainly of tungsten which is susceptible to oxidation. Therefore, the conductive plugs may cause contact defects if tungsten is oxidized during the process.

To deal with this problem, a silicon oxynitride (SiON) film is formed with a thickness of about 130 nm on the conductive plugs 32a and 32b and the first interlayer insulating film 11 by the plasma CVD method as an antioxidant insulating film 14 for preventing oxidation of these plugs 32a and 32b.

Note that, instead of the silicon oxynitride film, it is also possible to form a silicon nitride (SiN) film or an alumina film as the antioxidant insulating film 14.

Thereafter, a silicon oxide film is formed with a thickness of about 300 nm on the antioxidant insulating film 14 by the plasma CVD method using the TEOS gas. This silicon oxide film is formed as an underlying insulating film 15.

Next, processes to be conducted prior to obtaining a cross-sectional structure shown in FIG. 6B will be described below.

First, first holes 15a are formed in the underlying insulating film 15 and the antioxidant insulating film 14 located above the first conductive plugs 32a by patterning these insulating films.

Next, a titanium nitride film functioning as a glue film 35 is formed on the inner surfaces of the first holes 15a and on the underlying insulating film 15 by the sputtering method.

Moreover, a tungsten film functioning as a plug conductive film 36 is formed on this glue film 35 by the CVD method, thereby the first holes 15a are completely buried with this plug conductive film 36.

Subsequently, excessive portions of the glue film 35 and the plug conductive film 36 on the underlying insulating film 15 are polished and removed by the CMP method as shown in FIG. 6C. In this way, the glue film 35 and the plug conductive film 36 are left inside the first holes 15a as third conductive plugs 36a which are electrically connected to the first conductive plugs 32a.

This CMP process applies slurry such as W2000 manufactured by Cabot Microelectronics Corporation, which is configured to render a polishing speed of the glue film 35 and the plug conductive film 36 being polishing targets faster than a polishing speed of the underlying insulating film 15 located therebelow. Moreover, in order not to leave an unpolished portion on the underlying insulating film 15, the polishing amount in this CMP process is set to be thicker than the total thickness of the films 35 and 36. In other words, this CMP process is conducted as an overpolishing process.

Next, as shown in FIG. 6D, the underlying insulating film 15 made of silicon oxide is exposed to nitrogen-containing plasma such as ammonia ($NH_3$) plasma, thereby a NH group is bonded to each oxygen atom on the surface of the underlying insulating film 15.

In this ammonia plasma process, a parallel-plate plasma reactor is used. The reactor includes an opposing electrode which is located by about 9 mm (350 mils) away from the silicon substrate 1, for example. Then, the process is executed by supplying ammonia gas into a chamber at a flow rate of 350 sccm while maintaining a substrate temperature at 400° C. under a pressure of 266 Pa (2 Torr), and supplying high-frequency power of 100 W at a frequency of 13.56 MHz to the silicon substrate 1 while supplying high-frequency power of 55 W at a frequency of 350 kHz to the above-mentioned opposing electrode for 60 seconds.

Subsequently, a titanium film is formed with a thickness of about 20 nm on the underlying insulating film 15 and the third conductive plugs 36a as shown in FIG. 6E. This titanium film is formed as a conductive adhesive film 16.

The conditions for forming this conductive adhesive film 16 are not particularly limited. However, in this embodiment, the substrate temperature is set equal to 20° C. in an argon atmosphere at 0.15 Pa by use of the sputter chamber configured to set a distance between the silicon substrate 1 and a titanium target equal to 60 mm. Then, the conductive adhesive film 16 made of titanium is formed by supplying direct-current (DC) power at 2.6 kW to the chamber for 5 seconds.

Here, since the ammonia plasma process (see FIG. 6D) is carried out in advance to bond the NH groups to the oxygen atoms on the surface of the underlying insulating film 15, the titanium atoms deposited on the underlying insulating film 15 are hardly captured by the oxygen atoms on the surface of the underlying insulating film 15. Accordingly, the titanium atoms can move freely on the surface of the underlying insulating film 15, and it is therefore possible to form the conductive adhesive film 16 made of titanium which is highly self-organized in the (002) direction.

Thereafter, the conductive adhesive film 16 is subjected to rapid thermal annealing (RTA) in a nitrogen atmosphere at a substrate temperature of 650° C. for a processing period of 60 seconds. In this way, the conductive adhesive film 16 made of the titanium is nitrogenized, whereby the conductive adhesive film 16 is formed of the titanium nitride which is oriented in the (111) direction.

Here, the material of the conductive adhesive film 16 is not limited only to titanium nitride. The conductive adhesive film 16 may be made of any of titanium, titanium nitride, platinum, iridium, rhenium, ruthenium, palladium, rhodium and osmium, or an alloy thereof. Alternatively, it is possible to form the conductive adhesive film 16 by use of any of platinum oxide, iridium oxide, ruthenium oxide and palladium oxide.

Next, as shown in FIG. 6F, a titanium aluminum nitride (TiAlN) film functioning as a conductive oxygen barrier film 17 is formed with a thickness of 100 nm on this conductive adhesive film 16 by the reactive sputtering method.

The conductive oxygen barrier film 17 made of titanium aluminum nitride has an excellent oxygen transmission blocking function, and plays a role for preventing the occurrence of contact defects attributable to the oxidation of the third conductive plugs 36a located therebelow.

The conditions for forming this conductive oxygen barrier film 17 are not particularly limited. However, in this embodiment, an alloy target containing titanium and aluminum is used, and also the mixed gas of argon and nitrogen is used as sputtering gas. Moreover, the conductive oxygen barrier film 17 is formed under the conditions of a flow rate of argon gas equal to 40 sccm, a flow rate of nitrogen gas equal to 100 sccm, a pressure at 253.3 Pa, a substrate temperature at 400° C., and sputtering power equal to 1.0 kW.

In addition, the material of the conductive oxygen barrier film 17 is not limited only to titanium aluminum nitride. The conductive oxygen barrier film 17 may be made of any of titanium aluminum nitride, titanium aluminum oxynitride (TiAlON), tantalum aluminum nitride (TaAlN), and tantalum aluminum oxynitride (TaAlON).

The conductive oxygen barrier film 17 has enhanced adhesion strength to the films located below by the conductive adhesive film 16. Note that, it is possible to omit the conductive adhesive film 16 if the adhesion strength is not a serious problem. In that case, the conductive oxygen barrier film 17 is directly formed on each of the upper surfaces of the third conductive plugs 36a and the underlying insulating films 15.

Next, processes to be conducted prior to obtaining a cross-sectional structure shown in FIG. 6G will be described below.

First, a titanium film functioning as a conductive anti-diffusion film 22 is formed with a thickness ranging from 10 nm to 100 nm, for example with a thickness of about 50 nm, on the conductive oxygen barrier film 17 by the sputtering method.

The conditions for forming this titanium film are not particularly limited. In this embodiment, a sputtering chamber is used to form the titanium film. The sputtering chamber is configured to set a space between the silicon substrate 1 and a titanium target equal to 60 mm. Moreover, the above-mentioned titanium film is formed under an argon atmosphere at 0.15 Pa by applying DC power of 2.6 kW to the sputtering atmosphere for 13 seconds while the substrate temperature is maintained at 150° C.

Since titanium has a self-orienting property, the conductive anti-diffusion film 22 made of titanium is crystallized at the time of film formation. The crystalline orientation of the conductive anti-diffusion film 22 is typically in the (002) direction.

Next, the conductive anti-diffusion film 22 is subjected to RTA in a nitrogen atmosphere at a substrate temperature of 650° C. In this way, the titanium in the conductive anti-diffusion film 22 is nitrogenized, whereby the conductive anti-diffusion film 22 is formed of titanium nitride.

By such a nitrogenizing process, the crystalline orientation of titanium nitride is typically aligned in the (111) direction.

Note that, although the conductive anti-diffusion film 22 made of titanium nitride is formed by nitrogenizing the titanium film in this embodiment, the method for forming the titanium nitride film is not limited only to the foregoing method.

For example, it is possible to form the titanium nitride film by the reactive sputtering method configured to sputter a titanium target in nitrogen gas. In this case, the mixed gas of the argon gas at a flow rate of 50 sccm and the nitrogen gas at a flow rate of 20 sccm is used as sputtering gas. Moreover, the titanium nitride film with a thickness of 50 nm can be obtained by applying DC power of 8.3 kW to the sputtering atmosphere for 22 seconds while the substrate temperature is maintained at 200° C.

Subsequently, a platinum film serving as a first conductive film 23 is formed with a thickness of about 100 nm on this conductive anti-diffusion film 22 by the sputtering method.

This platinum film can be formed by maintaining the substrate temperature at 400° C. in an argon atmosphere at a pressure of 0.2 Pa and applying sputtering power of 0.5 kW to the sputtering atmosphere, for example.

Thereafter, the first conductive film 23 is subjected to RTA in the argon atmosphere for 60 seconds while the substrate temperature is set equal to or above 650° C. By performing this RTA process, the adhesion among the first conductive film 23, the conductive anti-diffusion film 22, and the conductive oxygen barrier film 17 is enhanced, and the crystallinity of the first conductive film 23 is also improved. Note that it is also possible to perform this RTA process in a nitrogen atmosphere instead of the argon atmosphere.

Here, since the conductive anti-diffusion film 22 is oriented in the (111) direction as described above, the crystalline orientation of the first conductive film 23 is also aligned in the (111) direction by means of this orientation.

Note that, although the platinum film is formed as the first conductive film 23 in this embodiment, it is also possible to form a palladium film as the first conductive film 23 instead. It is also conceivable to form the first conductive film 23 with a film made of any other platinum group elements. Nevertheless, the elements other than platinum and palladium exhibit the significant lattice mismatch with PZT to be described later, and thereby the crystallinity of PZT is degraded.

For example, as the lattice constant of PZT is equal to 3.96 Å, platinum having the lattice constant of 3.9 Å exhibits less lattice mismatch with PZT than iridium having the lattice constant of 3.8 Å, and thus improves the crystallinity of PZT. Accordingly, it is not favorable to form the first conductive film 23 as a single-layer film made of the other platinum group elements such as iridium.

Nevertheless, it is possible to form the first conductive film 23 as the laminated-layer film configured to expose either platinum or palladium on the upper surface, or namely, as the laminated-layer film having either a platinum film or a palladium film formed on the uppermost layer. In this case, it is possible to form a platinum oxide film or a platinum-containing alloy film as part of the first conductive film 23 below the platinum film or the palladium film.

Next, as shown in FIG. 6H, a thin PZT initial layer is formed with a thickness ranging, for example, from about 1 nm to about 50 nm, or typically from 20 nm to 30 nm, on the first conductive film 23 by the sputtering method. This PZT initial layer is formed as a first ferroelectric film 24b.

Here, one of reasons for setting the upper limit thickness of the first ferroelectric film 24b to 50 nm is that, if the first ferroelectric film 24b is formed with a thickness of greater than 50 nm, an electric field to be applied to the first ferroelectric film 24b becomes too weak at the time of operating the FeRAM, and consequently it is disadvantageous in light of low-voltage operation of the FeRAM. Moreover, it is favorable to form the first ferroelectric film 24b in a thickness equal to or below 50 nm in order to prevent a decrease in a switching charge amount Qsw of the first ferroelectric film 24b.

Meanwhile, if the film formation temperature of the first ferroelectric film 24b is too high, the platinum in the first conductive film 23 reacts with the lead in the first ferroelectric film 24b as described previously, which may lead to the risk of the decrease in the switching charge amount of the first ferroelectric film 24b even when the first ferroelectric film 24b is subjected to crystallization annealing to be described later.

For this reason, it is preferable to set the film formation temperature of the first ferroelectric film 24b as low as possible, such as a temperature equal to or below 80° C. In this embodiment, the first ferroelectric film 24b is formed at room temperature.

In addition to the sputtering method, another film formation method capable of forming the first ferroelectric film 24b at such a low temperature is the sol-gel method. Accordingly, the first ferroelectric film 24b may be formed by this sol-gel method.

On the contrary, in the MOCVD method, it is necessary to set the substrate temperature to a high temperature around 620° C. when forming the PZT film. Consequently, if the first ferroelectric film 24b is formed by the MOCVD method, the ferroelectric properties of the first ferroelectric film 24b such as the switching charge amount is degraded by the above-described reaction between the lead and the platinum.

After all, as the method of forming the first ferroelectric film 24b, it is preferable to use any of the sputtering method and the sol-gel method, which does not require the substrate heating. On the other hand, it is not favorable to use the MOCVD method that requires the substrate heating.

Here, in addition to the advantage capable of forming the first ferroelectric film 24b at a low temperature, the sputtering method also has an advantage that it is easier to dope a small amount of additive element to the first ferroelectric film 24b.

Utilizing such an advantage, it is preferable to add any of lanthanum, calcium, strontium, and niobium at a concentration in a range from 0.1 mol % to 5 mol % to PZT when forming the first ferroelectric film 24b. By using the first ferroelectric film 24b doped with any of these elements to a capacitor to be described later, it is possible to obtain effects such as improvement in fatigue-resistant and imprint characteristics of the capacitor, reduction in a leak current, and reduction in an operating voltage.

In this embodiment, the switching charge amount of the first ferroelectric film 24b is increased by doping calcium, lanthanum, and strontium at concentrations of 5 mol %, 2 mol %, and 2 mol %, respectively, to PZT. It is to be noted that the PZT doped with lanthanum may also be referred to as PLZT.

Moreover, the material of the first ferroelectric film 24b is not limited only to PZT as long as it is a ferroelectric material having an $ABO_3$-type perovskite structure (in which A is any one selected from the group consisting of Bi, Pb, Ba, Sr, Ca, Na, K and any of rare earth elements, and B is any one selected from the group consisting of Ti, Zr, Nb, Ta, W, Mn, Fe, Co and Cr).

Such a ferroelectric material satisfying the above-mentioned structure is BLT $((Bi, La)_4Ti_3O_{12})$, for example.

In addition, Bi layer-structure compounds such as $(Bi_{1-x}R_x)Ti_3O_{12}$ (in which R is a rare earth element and $0<x<1$), $SrBi_2Ta_2O_9$ (SBT), $SrBi_4Ti_4O_{15}$, and the like are usable as the constituent material of the first ferroelectric film 24b since these substances have the $ABO_3$-type perovskite structure when seen as one unit of crystal.

Incidentally, the first ferroelectric film 24b formed by the sputtering method as described above is not crystallized, and consequently is not directly usable as a capacitor dielectric body due to its small residual polarization charge amount.

To deal with this problem, in the next step, the first ferroelectric film 24b is crystallized by annealing as shown in FIG. 6I to align the crystalline orientation of PZT in the (111) direction that maximizes the polarization amount. Such an annealing process is also called as crystallization annealing.

The conditions for the crystallization annealing process are not particularly limited. However, in this embodiment, the substrate temperature is set in a range from 550° C. to 800° C., for example at 580° C. in the mixed gas atmosphere of oxygen and argon, and a thermal treatment period is set in a range from 30 to 120 seconds, for example for 90 seconds. Here, the flow rate of oxygen is set in a range from 0 sccm to 25 sccm, and the flow rate of argon is set 2000 sccm.

The optimal substrate temperature in the crystallization annealing process depends on the material of the first ferroelectric film 24b. For example, when the first ferroelectric film 24b is made of PZT or PZT doped with a small amount of an additive element, the substrate temperature is preferably set equal to or below 600° C. Meanwhile, when the first ferroelectric film 24b is made of BLT, the substrate temperature is preferably set equal to or below 700° C. When the first ferroelectric film 24b is made of SBT, the substrate temperature is preferably set equal to or below 800° C.

Note that the direction of the crystalline orientation of the PZT film after the crystallization annealing process depends on the film formation temperature in the course of sputtering the PZT film. For example, if the film formation temperature of the PZT film is higher than 80° C., the PZT film after crystallization annealing is oriented in the (101) direction. Consequently, it is difficult to align the crystalline orientation in the (111) direction to achieve a high polarization amount.

For this reason, it is preferable to form the first ferroelectric film 24b made of PZT by the sputtering method configured to set the substrate temperature equal to or below 80° C., for example at room temperature (20° C.) from the viewpoint of increasing the polarization amount as well.

Moreover, since the conductive anti-diffusion film 22 is oriented in the (111) direction as described previously, the first conductive film 23 thereon is also oriented in the (111) direction. As the first conductive film 23 located below the first ferroelectric film 24b is oriented in the (111) direction in this manner, the crystalline orientation of the first ferroelectric film 24b is easily aligned in the (111) direction by this crystallization annealing.

Incidentally, in the ferroelectric material of the $ABO_3$-type perovskite structure constituting the first ferroelectric film 24b, the atoms on the A site tend to be thermally diffused downward in the first ferroelectric film 24b by such a crystallization annealing. For example, when the PZT film is used as the first ferroelectric film 24b as described above, the lead atoms tend to be thermally diffused downward.

The first conductive film 23 formed below the first ferroelectric film 24b contains platinum or palladium. Such materials are apt to transmit the atoms on the A site such as lead. Accordingly, the lead atoms can be diffused into the first conductive film 23 from the first ferroelectric film 24b by crystallization annealing.

Nevertheless, since the conductive anti-diffusion film 22 is formed below the first conductive film 23 in this embodiment, the diffusion of the lead atoms is blocked by the conductive anti-diffusion film 22.

As a result, the lead atoms are not thermally diffused on the interface between the conductive oxygen battier film 17 and the conductive anti-diffusion film 22. In other words, no lead exists on that interface. It is, therefore, possible to prevent detachment or expansion of the first conductive film 23 attributable to the reaction between the conductive oxygen barrier film 17 and lead as illustrated in FIG. 5.

Next, as shown in FIG. 6J, a PZT film is formed with a thickness of about 80 nm on the first ferroelectric film 24b by the MOCVD method. This PZT film is formed as a second ferroelectric film 24c. The second ferroelectric film 24c formed by the MOCVD method is crystallized and the crystalline orientation thereof is aligned in the (111) direction at the time of film formation. Thus, it is not necessary to execute the crystallization annealing process to crystallize the second ferroelectric film 24c afterward.

Here, unlike the sputtering method, the switching charge amount Qsw of the capacitor is significantly reduced if an additive element such as lanthanum, calcium, strontium or niobium is added to PZT in the course of the MOCVD method. Accordingly, in the MOCVD method, it is preferable to form the second ferroelectric film 24c of pure PZT without adding any of these elements to the PZT.

The MOCVD method is conducted as follows.

First, the silicon substrate 1 is placed on the susceptor in the unillustrated reaction chamber.

Subsequently, oxygen is introduced to the reaction chamber at a flow rate of 2 slm, and the silicon substrate 1 is heated so as to stabilize the substrate temperature around 620° C.

Even if the temperature is heated in the oxygen atmosphere in this manner, the first conductive film 23 does not cause abnormal oxidation because the upper surface of the first conductive film 23 is covered with the first ferroelectric film 24b. It is, therefore, possible to suppress the surface roughness of the PZT film or the fluctuation in the crystalline orientation of the PZT film attributable to the abnormal oxidation of the first conductive film 23.

Then, a vaporized THF solvent is introduced to the reaction chamber. In this way, the first ferroelectric film 24b is exposed to the solvent gas atmosphere.

By supplying the solvent gas before supplying the raw material gas in this manner, it is possible to prevent the solidification of raw material gas inside vaporizers and pipes, and to avoid the clogging of pipes and the like. Note that it is also possible to use vaporized butyl acetate as the solvent gas instead of THF.

Thereafter, the raw material gases are prepared by vaporizing respective liquid raw materials of Pb, Zr, and Ti with vaporizers, and the formation of the PZT film is started by introducing the respective raw material gases into the reaction chamber.

Here, the respective liquid raw materials can be prepared by dissolving, for example, $Pb(DPM)_2$ (chemical formula: $Pb(C_{11}H_{19}O_2)_2$), $Zr(dmhd)_4$ (chemical formula: $Zr(C_9H_{15}O_2)_4$), and $Ti(O\text{-}iOr)_2(DPM)_2$ (chemical formula: $Ti(C_3H_7O)_2(C_{11}H_{19}O_2)_2$) into THF (tetrahydrofuran: $C_4H_8O$) solvents at a concentration of 0.3 mol/l, respectively. Here, the flow of the respective vaporized raw material gases is not particularly limited. In this embodiment, the liquid raw materials are vaporized by supplying them to vaporizers at the flow of 0.326 ml/min, 0.200 mil/min, and 0.200 ml/min, respectively, to obtain the Pb, Zr, and Ti raw material gases.

Thereafter, the PZT film is formed with a thickness of 80 nm by maintaining the aforementioned state approximately for 620 seconds under a pressure of 665 Pa (5 Torr).

In this way, the silicon substrate 1 is heated to a high temperature around 620° C. at the time of forming the second ferroelectric film 24c by the MOCVD method. However, since the first ferroelectric film 24b is formed below the second ferroelectric film 24c in advance, the first ferroelectric film 24b inhibits the movement of the lead atoms in the second ferroelectric film 24c to the first conductive film 23 due to the heat. Accordingly, the above-mentioned reaction between the lead and the platinum in the first conductive film 23 is suppressed. Hence, it is possible to prevent the deterioration in the ferroelectric properties of the second ferroelectric film 24c such as the switching charge amount.

In this way, a ferroelectric film 24 consisting of the first and second ferroelectric films 24b and 24c is formed on the first conductive film 23.

The second ferroelectric film 24c formed by the MOCVD method hardly reduces the switching charge amount Qsw even when the film thickness thereof is reduced for higher integration. Accordingly, the ferroelectric film 24 having the above-described two-layer structure has an advantage for the higher integration.

Here, it is preferable to form the film thickness of the first ferroelectric film 24b thinner than the film thickness of the second ferroelectric film 24c so that the second ferroelectric film 24 formed by the MOCVD method, which is advantageous for the higher integration, constitutes the majority of the ferroelectric film 24.

However, if it is not necessary to achieve the higher integration, it is also possible to substitute the ferroelectric film 24 with a single layer of the PZT film formed by the sputtering method or the sol-gel method. As described previously, the sputtering method and the sol-gel method are able to form the PZT film at a lower temperature as compared to the MOCVD method. Accordingly, it is not necessary to provide the first ferroelectric film 24b that serves for preventing the diffusion of the lead atoms by the heat. For this reason, the ferroelectric properties of the ferroelectric film 24 are not deteriorated even when the single-layer PZT film formed by any of these film formation methods is used as the ferroelectric film 24.

When the ferroelectric film 24 is formed by sputtering method or the sol-gel method as described above, the ferroelectric film 24 is subjected to crystallization annealing to crystallize PZT. During this crystallization annealing process, the atoms on the A site that constitute the ferroelectric film 24 are thermally diffused downward as described previously. However, the thermal diffusion is blocked by the conductive anti-diffusion film 22, and the detachment of the first conductive film 23 is thereby prevented.

Subsequently, as show in FIG. 6K, an iridium oxide (IrOx) film serving as a first conductive metal oxide film 25d is formed with a thickness of about 50 nm on the ferroelectric film 24 by the sputtering method while the silicon substrate 1 is heated. Note that, the iridium oxide film, which is formed by the sputtering method while heating the silicon substrate 1 in this manner, is crystallized at the time of film formation without carrying out the crystallization process.

The conditions for forming the first conductive metal oxide film 25d are not particularly limited. In this embodiment, the substrate temperature is set at 300° C., and the mixed gas of oxygen at a flow rate of 140 sccm and argon gas at a flow rate of 60 sccm is used as the sputtering gas. Moreover, the sputtering power is set to 1 kW.

Here, when the first conductive metal oxide film 25d is formed by the sputtering method, the ferroelectric film 24 may be damaged by the sputtering gas, and may cause the lack of the oxygen concentration in that film. Accordingly, the ferroelectric properties of the film may be deteriorated.

To deal with this problem, the RTA process is performed in the mixed gas atmosphere of argon and oxygen after the first conductive metal oxide film 25d is formed to recover the damages on the ferroelectric film 24 caused by the sputtering processes and to compensate for the lack of oxygen in the ferroelectric film 24.

The conditions of this RTA process are not particularly limited. In this embodiment, the substrate temperature is set to 725° C., and the processing time period is set to 60 seconds. Furthermore, the flow of argon and oxygen are set to 2000 sccm and 20 sccm, respectively.

Here, the first conductive metal oxide film 25d is crystallized at the time of film formation. Reflecting the crystal grains of the first conductive metal oxide film 25d, unevenness is formed in the interface between the first conductive metal oxide film 25d and the ferroelectric film 24. The above RTA process also has an advantage to planarize the unevenness.

In the above-described RTA process, the atoms on the A site constituting the ferroelectric film 24, i.e. the lead atoms are thermally diffused downward. However, as described previously, the thermal diffusion is inhibited by the conductive anti-diffusion film 22 so that the detachment or the expansion of the first conductive film 23 does not occur, which is attributable to the reaction between the lead atoms and the conductive oxygen barrier film 17.

Next, an iridium oxide film serving as a second conductive metal oxide film 25e is formed with a thickness ranging from about 100 nm to 300 nm, for example with a thickness of 200 nm, on the first conductive metal oxide film 25d by the sputtering method while the substrate temperature is maintained at room temperature. The second conductive metal oxide film 25e is formed in an argon atmosphere at a pressure of 0.8 Pa while the sputtering power is set 1.0 kW, and while the film formation time period is set 79 seconds.

Here, unlike the first conductive metal oxide film 25d crystallized at the high film formation temperature, the second conductive metal oxide film 25e is amorphous because the film is formed by the sputtering method while the substrate temperature is set to room temperature.

Incidentally, in the above-described iridium oxide sputtering process, the iridium atoms sputtered from the iridium target are oxidized in the sputtering atmosphere, whereby iridium oxide thus formed is deposited on the substrate. Therefore, some of the deposited iridium oxide may be insufficiently oxidized in the atmosphere, and the iridium oxide film is apt to contain less oxygen as a whole than that of the stoichiometric composition ($IrO_2$).

However, the catalytic action of the second conductive metal oxide film 25e is enhanced by the lack of oxygen in the second conductive metal oxide film 25e. Accordingly, hydrogen can be generated as a result of the contact of outside moisture with the second conductive metal oxide film 25e. It is necessary to minimize the generation of hydrogen in the manufacturing process of the FeRAM because hydrogen causes the reduction reaction of the ferroelectric film 24, and thereby deteriorates the ferroelectric properties thereof.

For this reason, from the viewpoint of preventing the generation of hydrogen, it is preferable to set the oxygen content of the second conductive metal oxide film 25e higher than the oxygen content of the first conductive metal oxide film 25d.

Accordingly, in this embodiment, the proportion of the flow rate of oxygen is increased at the time of film formation of the second conductive metal oxide film 25e as compared to the film formation of the first conductive metal oxide film 25d to render the iridium oxide composition of the second conductive metal oxide film 25e close to the stoichiometric composition ($IrO_2$), thereby the catalytic action of the second conductive metal oxide film 25e is suppressed.

The second conductive metal oxide film 25e and the first conductive metal oxide film 25d collectively constitute a conductive metal oxide film 25b as shown in FIG. 6K.

Note that, the constituent material of the first and second conductive metal oxide films 25d and 25e is not limited only to iridium oxide. The first and second conductive metal oxide films 25d and 25e may be made of an oxide of any of iridium, ruthenium, rhodium, rhenium, osmium, and palladium. In addition, it is also possible to form the conductive metal oxide film 25b by stacking oxides of these elements.

Subsequently, as shown in FIG. 6L, an iridium film serving as a conductivity enhancing film 25c is formed with a thickness ranging from 50 nm to 100 nm on the conductive metal oxide film 25b by the sputtering method. The sputtering method is carried out in an argon atmosphere at a pressure of 1 Pa, and sputtering power of 1.0 kW is applied to the sputtering atmosphere.

The conductivity enhancing film 25c and the conductive metal oxide film 25b located therebelow collectively constitute a second conductive film 25. The conductivity enhancing film 25c serves for compensating for the conductivity of the second conductive film 25 which tends to be insufficient only by use of the conductive metal oxide film 25b. Moreover, iridium contained in the conductivity enhancing film 25c has a fine barrier property against hydrogen. Accordingly, the conductivity enhancing film 25c also serves for preventing deterioration in the ferroelectric film 24 by blocking outside hydrogen.

Note that, the conductivity enhancing film 25c may be formed any of a ruthenium film, a rhodium film, and a palladium film instead of the iridium film.

Thereafter, the back surface of the silicon substrate 1 is cleaned.

Next, as shown in FIG. 6M, a titanium nitride film is formed on the second conductive film 25 by the sputtering method. This titanium nitride film is formed as a first mask material layer 26.

Moreover, a silicon oxide film serving as a second mask material layer 27 is formed on the first mask material layer 26 by the plasma CVD method using TEOS gas.

Subsequently, as shown in FIG. 6N, a second hard mask 27a is formed by patterning the second mask material layer 27 into an island shape.

Next, processes to be conducted prior to obtaining a cross-sectional structure shown in FIG. 6O will be described below.

First, a first hard mask 26a is formed by etching the first mask material layer 26 while using the second hard mask 27a as the mask.

Subsequently, the portions of the respective films 22 to 25 not covered with the first and second hard masks 26a and 27a are subjected to dry etching.

In this way, the first conductive film 23, the ferroelectric film 24, and the second conductive film 25 are formed into a lower electrode 23a, a capacitor dielectric film 24a, and an upper electrode 25a, respectively, and these constituents collectively constitute a ferroelectric capacitor Q. Meanwhile, by this dry etching process, the conductive anti-diffusion film 22 is patterned into an island shape which is the same planar shape as that of the lower electrode 23a.

The gas used for the dry etching process is not particularly limited. However, the mixed gas of HBr and oxygen is used as the etching gas for the conductive anti-diffusion film 22, the first conductive film 23, and the second conductive film 25. On the other hand, the mixed gas of chlorine and argon is used as the etching gas for the ferroelectric film 24. Note that it is also possible to add $C_4F_8$ gas to these gases.

Moreover, since the conductive oxygen barrier film 17 has etching resistance against the etching gas for this conductive anti-diffusion film 22, the conductive oxygen barrier film 17 remains on the entire surface of the conductive adhesive film 16 after the capacitor Q is formed.

The capacitor Q thus formed is electrically connected to the first conductive plug 32a via the conductive anti-diffusion film 22, the conductive oxygen barrier film 17, the conductive adhesive film 16, and the third conductive plug 36a.

Subsequently, as shown in FIG. 6P, the second hard mask 27a made of silicon oxide is removed by wet etching while using the mixed solution of hydrogen peroxide ($H_2O_2$), ammonia, and water as the etching solution. Note that it is also possible to remove the second hard mask 27a by dry etching.

Next, processes to be conducted prior to obtaining a cross-sectional structure shown in FIG. 6Q will be described below.

First, the conductive adhesive film 16 and the conductive oxygen barrier film 17 are etched by use of the first hard mask 26a as the mask so as to leave these films only below the capacitor Q. This etching process is conducted by dry etching, and the mixed gas of, for example, argon and chlorine is used as the etching gas.

Moreover, since the first hard mask 26a is also etched by this etching gas, the first hard mask 26a is removed when the etching process is completed, and consequently the upper surface of the upper electrode 25a is exposed.

Subsequently, as shown in FIG. 6R, an alumina ($Al_2O_3$) film is formed with a thickness of about 20 nm so as to cover the capacitor Q. The alumina film is formed as a first capacitor protection insulating film 39. The alumina constituting the first capacitor protection insulating film 39 has an excellent performance to prevent hydrogen transmission. Accordingly, outside hydrogen is blocked by this first capacitor protection insulating film 39. In this way, it is possible to prevent deterioration in the capacitor dielectric film 24a attributable to hydrogen.

Here, the capacitor dielectric film 24a is damaged by the dry etching process (see FIG. 6O) for forming the capacitor Q and by the formation of the first capacitor protection insulating film 39 by the sputtering method.

In order to allow the capacitor dielectric film 24a to recover from such damages, the capacitor dielectric film 24a is subjected to recovery annealing in an oxygen-containing atmosphere as shown in FIG. 6S. The conditions for this recovery annealing process are not particularly limited. However, in this embodiment, the substrate temperature in a furnace is set in a range from 550° C. to 700° C., for example 650° C., and the annealing process is continued for about 60 minutes.

Subsequently, as shown in FIG. 6T, another alumina film is formed with a thickness of about 20 nm on the first capacitor protection insulating film 39 by the CVD method. This alumina film is formed as a second capacitor protection insulating film 40.

Next, processes to be conducted prior to obtaining a cross-sectional structure shown in FIG. 6U will be described below.

First, a silicon oxide film serving as a second interlayer insulating film 41 is formed on the second capacitor protection insulating film 40 by the plasma CVD method using the TEOS gas as reactive gas. The reactive gas also contains oxygen gas and helium gas. Although the film thickness of the second interlayer insulating film 41 is not particularly limited, the film thickness on the flat surface of the silicon substrate 1 is set 1500 nm in this embodiment.

Note that it is also possible to form an inorganic insulating film as the second interlayer insulating film 41 instead of the silicon oxide film.

Thereafter, the surface of the second interlayer insulating film 41 is polished and planarized by the CMP method.

Then, the surface of the second interlayer insulating film 41 is exposed to $N_2O$ plasma as a dehydrating process for the second interlayer insulating film 41. This $N_2O$ plasma removes moisture remaining inside the second interlayer insulating film 41, and prevents the second interlayer insulating film 41 from reabsorbing moisture.

Note that it is also possible to carry out the $N_2$ plasma process as the dehydrating process.

Subsequently, a flat alumina film is formed with a thickness ranging from about 20 nm to 100 nm on the second interlayer insulating film 41 by the sputtering method. The alumina film is formed as a third capacitor protection insulating film 42. This third capacitor protection insulating film 42 is formed on the planarized second interlayer insulating film 41, and thus is not required to have an excellent coverage characteristic. Accordingly, the alumina film is formed by the low-cost sputtering method as described above. Nevertheless, the method of forming the third capacitor protection insulating film 42 is not limited only to the sputtering method, and the CVD method is also applicable thereto.

Thereafter, as shown in FIG. 6V, a silicon oxide film serving as a cap insulating film 43 is formed with a thickness ranging from about 300 nm to 500 nm on the third capacitor protection insulating film 42 by the plasma CVD method using the TEOS gas. Note that it is also possible to form a silicon oxynitride film or a silicon nitride film as the cap insulating film 43 instead.

Next, processes to be conducted prior to obtaining a cross-sectional structure shown in FIG. 6W will be described below.

First, the first to third capacitor protection insulating films 39, 40, and 42, the second interlayer insulating film 41, and the cap insulating film 43 are patterned to form a second hole 41a through these films located above the upper electrode 25a.

Subsequently, the silicon substrate 1 is put into an unillustrated furnace in order to allow the capacitor dielectric film 24a to recover from damages suffered in the precedent processes. Then, the silicon substrate 1 is subjected to recovery annealing for about 40 minutes in an oxygen atmosphere while the substrate temperature is set 550° C.

Next, the first to third capacitor protection insulating films 39, 40, and 42, the second interlayer insulating film 41, the cap insulating film 43, the underlying insulating film 15, and the antioxidant insulating film 14 located above the second conductive plug 32b are patterned to form a third hole 41b through these films.

Note that the second hole 41a is covered with a resist pattern during this patterning process, and is protected from the etching atmosphere by the resist pattern.

Here, if an attempt is made to form these holes 41a and 41b at the same time, the upper electrode 25a in the second hole 41a is exposed to the etching atmosphere for a long time period until the deep third hole 41b is completely opened. Accordingly, there arises the problem of deterioration in the capacitor dielectric film 24a.

In this embodiment, the second and third holes 41a and 41b having mutually different depths are formed separately as described above. In this way, it is possible to avoid such a problem.

Moreover, the second conductive plug 32b above the second source/drain region 8b remains covered with the antioxidant insulating film 14 until the completion of this process. It is, therefore, possible to prevent the occurrence of the contact defect attributable to the oxidation of tungsten that constitutes the second conductive plug 32b.

Subsequently, a titanium film and a titanium nitride film collectively serving as a glue film are formed in this order above the cap insulating film 43 and on the inner surfaces of the second and third holes 41a and 41b by the sputtering method.

Note that it is also possible to form the titanium nitride film by the MOCVD method. In this case, it is preferable to anneal the titanium nitride film in an atmosphere prepared by converting nitrogen and hydrogen into plasma in order to remove carbon from the titanium nitride film. Even when the annealing process is carried out in the hydrogen-containing atmosphere in this manner, the conductivity enhancing film 25c (see FIG. 6L) made of iridium and formed on the uppermost layer of the upper electrode 25a blocks hydrogen. Accordingly, there is no chance of the reduction reaction of the conductive metal oxide film 25b by hydrogen.

Moreover, a tungsten film is formed on the glue film by the CVD method so as to bury the second and third holes 41a and 41b completely with this tungsten film.

Thereafter, unnecessary portions of the glue film and the tungsten film on the cap insulating film 43 are polished and removed by the CMP method. Accordingly, these films are left only inside the second and third holes 41a and 41b as fourth and fifth conductive plugs 47a and 47b, respectively.

Of these plugs, the fourth conductive plug 47a is electrically connected to the upper electrode 25a of the capacitor Q. Meanwhile, the fifth conductive plug 47b is electrically connected to the second conductive plug 32b. The fifth conductive plug 47b and the second conductive plug 32b collectively constitute part of a bit line.

Thereafter, as shown in FIG. 6X, a metal laminated film is formed on the cap insulating film 43 and the conductive plugs 47a and 47b by the sputtering method. Then, a metal interconnect 49a and a bit-line conductive pad 49b are formed by patterning this metal laminated film.

The metal laminated film is formed by stacking a titanium film with a thickness of 60 nm, a titanium nitride film with a thickness of 30 nm, a copper-containing aluminum film with a thickness of 360 nm, another titanium film with a thickness of 5 nm, and another titanium nitride film with a thickness of 70 nm in this order.

In this way, the basic structure of the semiconductor device of this embodiment is completed.

According to the above-described embodiment, the conductive anti-diffusion film 22 is formed between the conductive oxygen barrier film 17 and the lower electrode 23a as shown in FIG. 6X. Therefore, the thermal diffusion of the lead atoms in the ferroelectric film 24 is blocked by the conductive anti-diffusion film 22 at the time of performing the annealing processes after the formation of the first conductive film 23 such as the crystallization annealing process for the first ferroelectric film 24b or the annealing process for the first conductive metal oxide film 25d constituting the upper electrode 25a. As a result, the lead atoms do not reach the conductive oxygen barrier film 17, and thus it is possible to prevent detachment and expansion of the first conductive film 23 attributable to the reaction between the lead atoms and the conductive oxygen barrier film 17, and thereby the product yields of semiconductor devices are improved.

Here, the material of the conductive anti-diffusion film 22 is not limited only to the conductive metal nitride such as titanium nitride as long as the material can prevent diffusion of the element on the A site of the ferroelectric film 24, namely the lead atoms.

In particular, iridium and ruthenium have an excellent anti-diffusion function against the lead atoms. Therefore, an alloy containing any of these elements is usable as the material of the conductive anti-diffusion film 22. In this case, the conductive anti-diffusion film 22 may be formed with a thickness ranging from about 30 nm to 100 nm.

Here, the reason for setting the lower limit of the thickness to 30 nm is that the barrier property against the lead atoms is reduced if the film is thinner than 30 nm. Moreover, the reason for setting the upper limit of the thickness to 100 nm is that it is difficult to etch the conductive anti-diffusion film 22 show in FIG. 6O if the film is thicker than 100 nm.

Examples of the alloy containing any of iridium and ruthenium include an alloy of either iridium or ruthenium with at least one element selected from the groups consisting of tungsten, tantalum, platinum, rhodium, rhenium, gold, and osmium.

Among them, tungsten is a material extremely susceptible to oxidation if used as a single body, but is hardly oxidized when used as the alloy with iridium or ruthenium. For this reason, contact defects as concerned in JP-A Hei 6 (1994)-326270 hardly occur in the case of using such an alloy as the conductive anti-diffusion film 22.

Meanwhile, in addition to titanium nitride, the conductive metal nitride usable as the material of the conductive anti-diffusion film 22 may include zirconium nitride, hafnium nitride, tantalum nitride, chromium nitride, and niobium nitride. The conductive anti-diffusion film 22 may be made of any of these materials.

When constructing the conductive anti-diffusion film 22 from the conductive metal nitride, it is preferable to set the thickness of the film equal to or above 10 nm because the barrier property against the lead atoms is reduced if the thickness is below 10 nm.

Note that it is also conceivable to construct the conductive anti-diffusion film 22 from oxide. However, if the conductive anti-diffusion film 22 is made of oxide, there is the risk of contact defects attributable to the oxidation of the third conductive plugs 36a below the conductive anti-diffusion film 22 by oxygen therein. It is, therefore, preferable to form the conductive anti-diffusion film 22 made of the conductive material other than oxides, which is capable of preventing the diffusion of the constituent element of the capacitor dielectric film 24a, such as the alloy containing any of iridium and ruthenium or the conductive metal nitrides mentioned above.

Moreover, as to the film thicknesses of the conductive anti-diffusion film 22 and the lower electrode 23a, it is preferable to set the thickness of the lower electrode 23a greater than the thickness of the conductive anti-diffusion film 22 as described in this embodiment. This is because the fluctuation in the crystalline orientation of the lower electrode 23a associated with the lattice mismatch with the conductive anti-diffusion film 22 hardly occurs on the upper surface of the lower electrode 23a, and thus it is easier to align the crystalline orientation of the capacitor dielectric film 24a in the (111) direction by forming the lower electrode 23a with the greater thickness than that of the conductive anti-diffusion film 22.

Moreover, by using the conductive crystal material such as titanium nitride having the same (111) orientation as that of the capacitor dielectric film 24a as the material of the conductive anti-diffusion film 22, it is possible to orient the capacitor dielectric film 24a favorably in the (111) direction that maximizes the polarization amount.

Meanwhile, as to the capacitor dielectric film 24a, the first ferroelectric film 24b is formed in advance by the sputtering method prior to the formation of the second ferroelectric film 24c by the MOCVD method. Therefore, the first conductive film 23 is not abnormally oxidized even when the silicon substrate 1 is heated in the oxygen atmosphere at the time of forming the second ferroelectric film 24c.

It is, therefore, possible to prevent the surface roughness of the second ferroelectric film 24c caused by the abnormal oxidation of the first conductive film 23, and thereby it is possible to form the second ferroelectric film 24c having the smooth surface morphology. In addition, the fluctuation in the crystalline orientation of the second ferroelectric film 24c partially attributable to the abnormal oxidation is also suppressed. Accordingly, it is possible to provide the method for manufacturing a semiconductor device suitable for mass production of FeRAMs.

According to these features, this embodiment can provide the semiconductor device including the highly reliable capacitor Q.

(3) Second Embodiment

FIGS. 7A to 7L are cross-sectional views showing states in the course of manufacturing a semiconductor device according to a second embodiment of the present invention. In the drawings, the constituents described in the first embodiment are indicated with the same reference numerals as those in the first embodiment, and the explanations thereof will be omitted hereinafter.

In the process shown in FIG. 6C of the first embodiment, the third conductive plug 36a is formed by polishing the glue film 35 and the plug conductive film 36 by the CMP method.

However, relative to the slurry used in the CMP process, the polishing speed of the glue film 35 and the plug conductive film 36 are faster than that of the underlying insulating film 15 located therebelow. Accordingly, it is difficult to align the levels of the upper surfaces of the third conductive plugs 36a and the underlying insulating film 15, respectively, at the time of completing the CMP process.

Figure 7A:
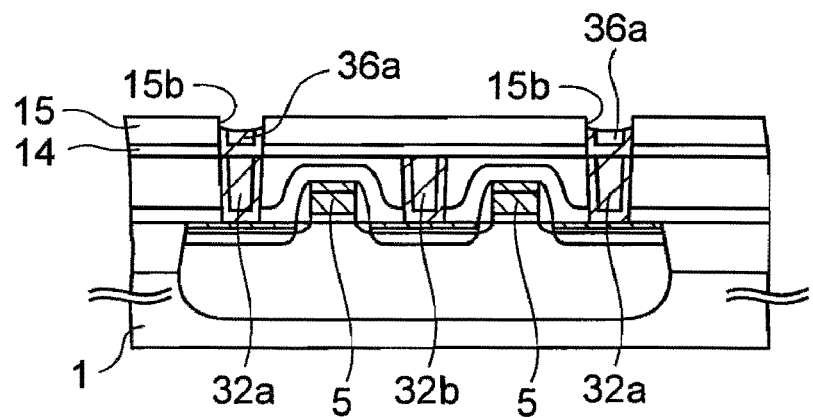
FIGS. 7A to 7L are cross-sectional views showing states in the course of manufacturing a semiconductor device according to a second embodiment of the present invention.

For this reason, recesses 15b are actually formed on the underlying insulating film 15 after the CMP process as shown in FIG. 7A, and the levels of the upper surfaces of the third conductive plugs 36a become lower than that of the underlying insulating film 15. The depth of each recess 15b is in a range from 20 nm to 50 nm, and is typically around 50 nm.

However, if the recesses 15b are present, the crystalline orientation of the lower electrode 23a and the capacitor dielectric film 24a is are fluctuated. As a consequence, there arises the problem of deterioration in the ferroelectric properties of the capacitor dielectric film 24a.

This embodiment applies the following processes to solve this problem.

Figure 7B:
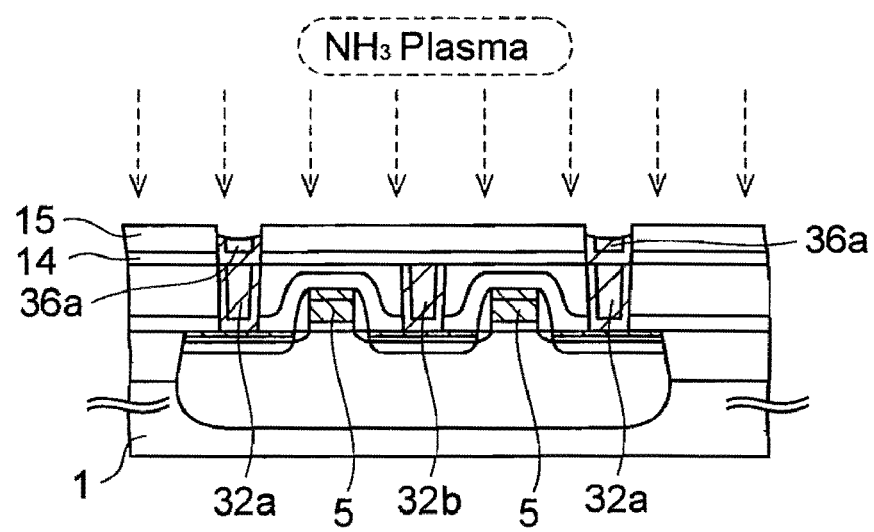

First, as shown in FIG. 7B, the underlying insulating film 15 is subjected to the ammonia plasma process so as to bond the NH groups to the oxygen atoms on the surface of the underlying insulating film 15.

In this ammonia plasma process, a parallel-plate plasma reactor is used. The reactor includes an opposing electrode which is located in a position just about 9 mm (350 mils) away from the silicon substrate 1, for example. Then, the process is executed by supplying ammonia gas into a chamber at a flow rate of 350 sccm while maintaining the substrate temperature at 400° C. under a pressure of 266 Pa (2 Torr), and supplying high-frequency power of 100 W at a frequency of 13.56 MHz to the silicon substrate 1 while supplying high-frequency power of 55 W at a frequency of 350 kHz to the above-mentioned opposing electrode for 60 seconds.

Figure 7C:
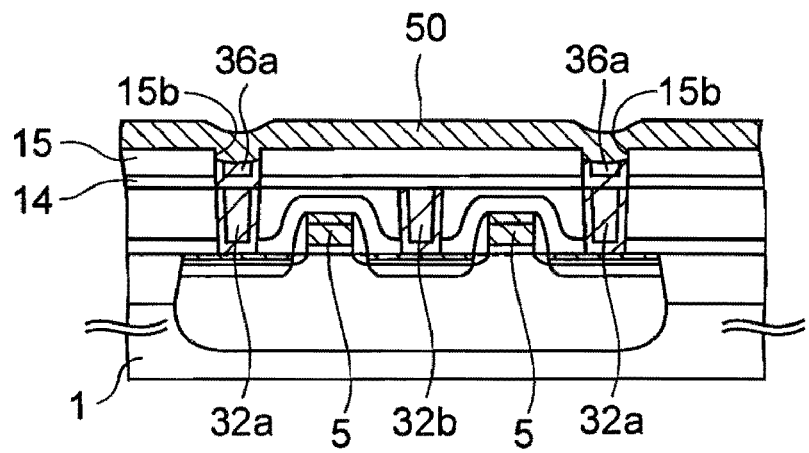

Subsequently, a titanium film serving as a planarization conductive film 50 is formed with a thickness ranging from 100 nm to 300 nm, for example with a thickness of about 100 nm on the underlying insulating film 15 and the third conductive plugs 36a as shown in FIG. 7C so as to bury the recesses 15b completely with this planarization conductive film 50.

The conditions for forming this planarization conductive film 50 are not particularly limited. However, in this embodiment, the planarization conductive film 50 is formed by use of the sputter chamber configured to set a distance between the silicon substrate 1 and a titanium target equal to 60 mm, and by applying sputtering DC power at 2.6 kW for 35 seconds in an argon atmosphere at a pressure of 0.15 Pa while setting the substrate temperature equal to 20° C.

Moreover, the NH groups are bonded to the oxygen atoms on the surface of the underlying insulating film 15 by carrying out the ammonia plasma process (FIG. 7B) before the planarization conductive film 50 is formed. Accordingly, the titanium atoms deposited on the underlying insulating film 15 are hardly captured by the oxygen atoms on the surface of the underlying insulating film 15. As a result, the titanium atoms can move freely on the surface of the underlying insulating film 15, and it is therefore possible to form the planarization conductive film 50 made of titanium which is highly self-organized in the (002) direction.

Note that the planarization conductive film 50 is not only limited to the titanium film. It is also possible to form any of a tungsten film, a silicon film, and a copper film as the planarization conductive film 50.

Thereafter, the planarization conductive film 50 is subjected to RTA in a nitrogen atmosphere at a substrate temperature of 650° C. In this way, the planarization conductive film 50 made of titanium is nitrogenized, whereby the planarization conductive film 50 is formed of titanium nitride and oriented in the (111) direction.

Here, concave portions are formed on the upper surface of the planarization conductive film 50 which are caused by the recesses 15b formed on the underlying insulating film 15 around the third conductive plugs 36a as described previously. If such concave portions are formed, there is the risk of deterioration in the crystallinity of the ferroelectric film to be formed above the planarization conductive film 50 afterward.

Figure 7D:
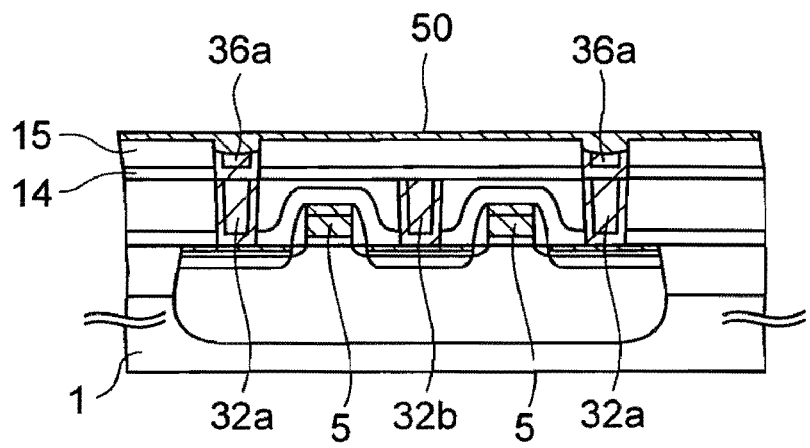

Accordingly, in this embodiment, the upper surface of the planarization conductive film 50 is polished and planarized by the CMP process, and the concave portions are removed as shown in FIG. 7D. The slurry to be used in this CMP process is not particularly limited. However, in this embodiment SSW2000 manufactured by Cabot Microelectronics Corporation is used.

The thickness of the planarization conductive film 50 after the CMP process varies in the surface of the silicon substrate or among the silicon substrates due to polishing errors. In consideration of such variation, this embodiment sets a target value for the thickness of the planarization conductive film 50 after the CMP process in a range from 50 nm to 100 nm, or more preferably 50 nm by controlling a polishing period.

Incidentally, after the planarization conductive film 50 is subjected to the CMP process in this manner, crystals located near the upper surface of the planarization conductive film 50 are distorted by polishing. If the lower electrode of the capacitor is formed above the planarization conductive film 50 having the distorted crystals, the lower electrode will exploit the distortion, and the crystallinity of the lower electrode will be deteriorated. Eventually, the ferroelectric properties of the ferroelectric film on the lower electrode will be deteriorated.

Figure 7E:
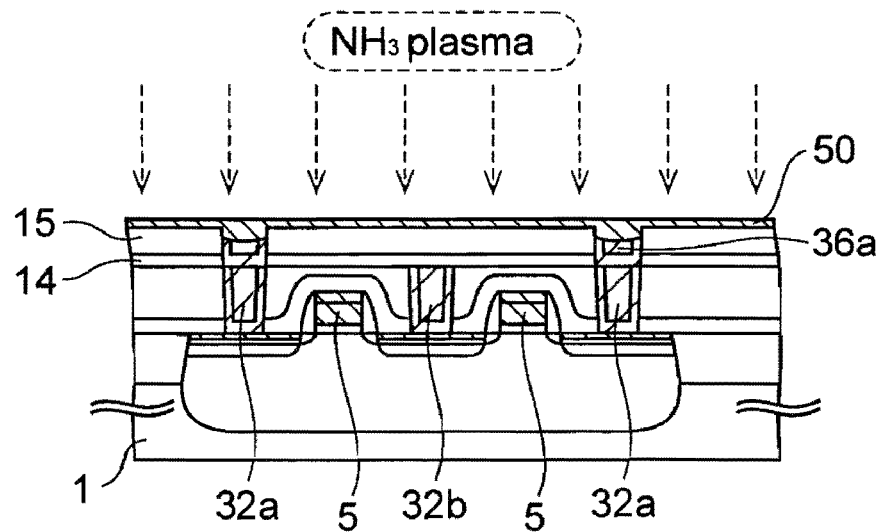

To avoid such a problem, in the next process, the upper surface of the planarization conductive film 50 is exposed to ammonia plasma as shown in FIG. 7E so as to prevent the transfer of the crystal distortion on the polarization conductive film 50 to the film located thereon.

Figure 7F:
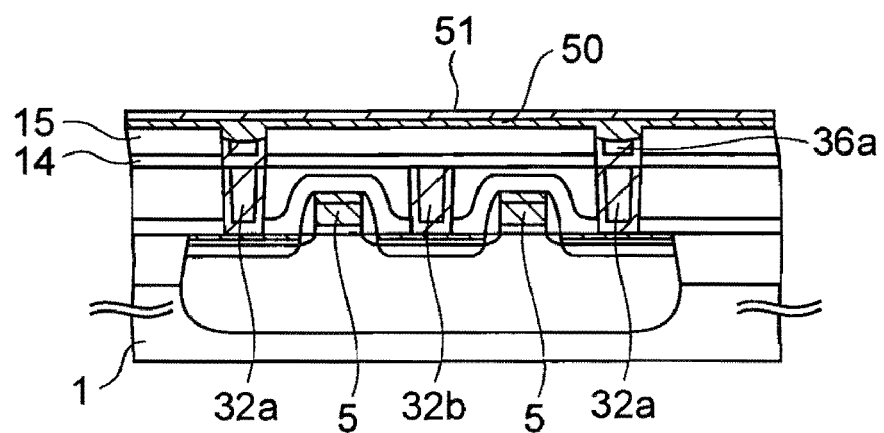

Next, as shown in FIG. 7F, an iridium film serving as a conductive adhesive film 51 is formed on the planarization conductive film 50 by the sputtering method after the crystal distortion is resolved by the ammonia plasma process. The conductive adhesive film 51 functions as a film for enhancing adhesion strength between the upper film and the lower film. It is desirable to set the thickness of the conductive adhesive film 51 as thin as possible. Specifically, it is desirable to form the film, for example, with a thickness equal to or below 20 nm, or more preferably in a range from 5 nm to 10 nm.

Figure 7G:
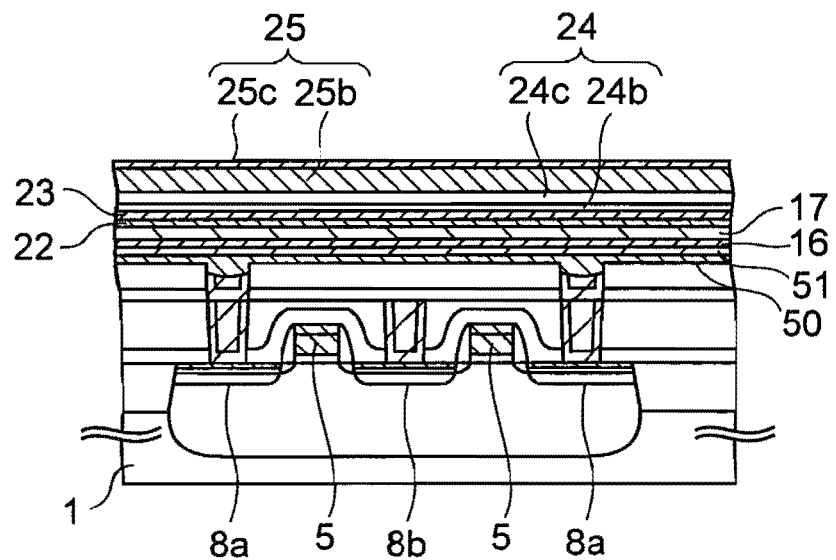

Subsequently, the films 16, 17, and 22 to 25 are stacked as shown in FIG. 7G by executing the processes described with reference to FIGS. 6E to 6L in the first embodiment.

Note that, in these processes, the conductive anti-diffusion film 22 made of titanium nitride is formed between the conductive oxygen barrier film 17 and the first conductive film 23 as in the case of the first embodiment. Therefore, it is possible to prevent the lead atoms in the ferroelectric film 24 made of PZT from being thermally diffused and reaching the conductive oxygen barrier film 17, and thereby it is possible to suppress the detachment of the first conductive film 23 caused by the reaction between the lead and the conductive oxygen barrier film 17.

Figure 7H:
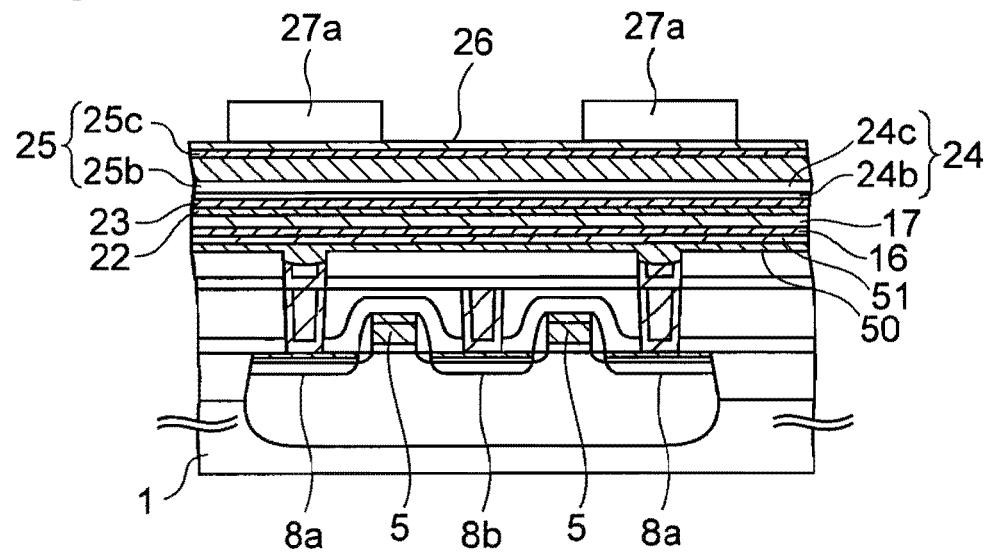

Subsequently, the first mask material layer 26 and the second hard mask 27a are formed on the second conductive film 25 as shown in FIG. 7H by executing the processes described with reference to FIGS. 6M and 6N.

Figure 7I:
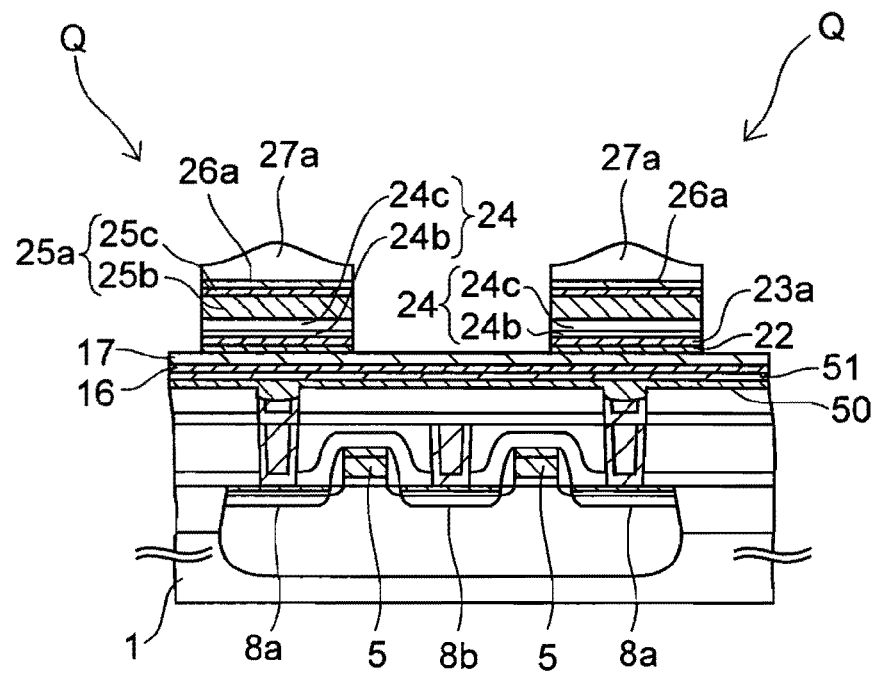

Next, the first hard mask 26a is formed as shown in FIG. 7I by etching the first mask material layer 26 while using the second hard mask 27a as the mask.

Thereafter, portions of the second conductive film 25, the ferroelectric film 24, the first conductive film 23, and the conductive anti-diffusion film 22 not covered with the first and second hard masks 26a and 27a are subjected to dry etching. In this way, the capacitor Q including the lower electrode 23a, the capacitor dielectric film 24a, and the upper electrode 25a is formed, and the conductive anti-diffusion film 22 is patterned into an island shape below the lower electrode 25a.

In this etching process, as in the case of the first embodiment, the mixed gas of HBr and oxygen is used as the etching gas for the first conductive film 23, the second conductive film 25, and the conductive anti-diffusion film 22. Meanwhile, the mixed gas of chlorine and argon is used as the etching gas for the ferroelectric film 24.

Figure 7J:
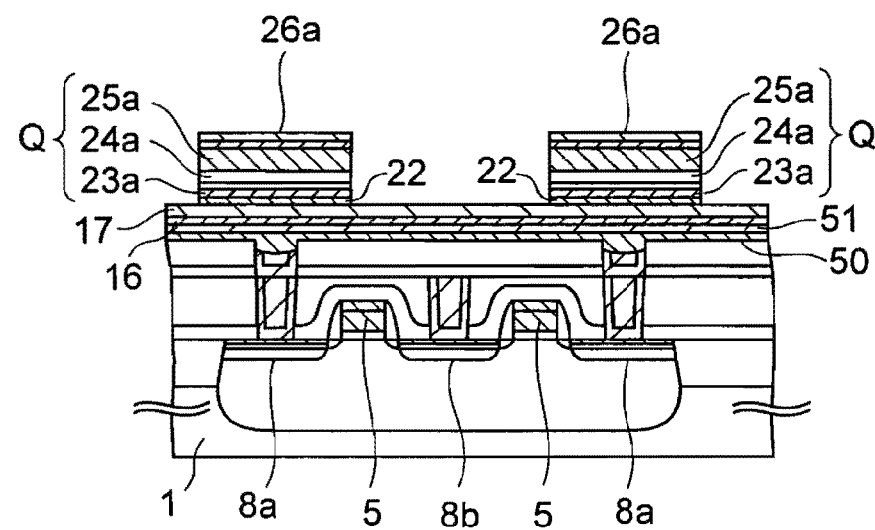

Subsequently, as shown in FIG. 7J, the second hard mask 27a made of silicon oxide is removed by wet etching while using the mixed solution of hydrogen peroxide, ammonia, and water as the etching solution. Note that it is also possible to remove the second hard mask 27a by dry etching.

Figure 7K:
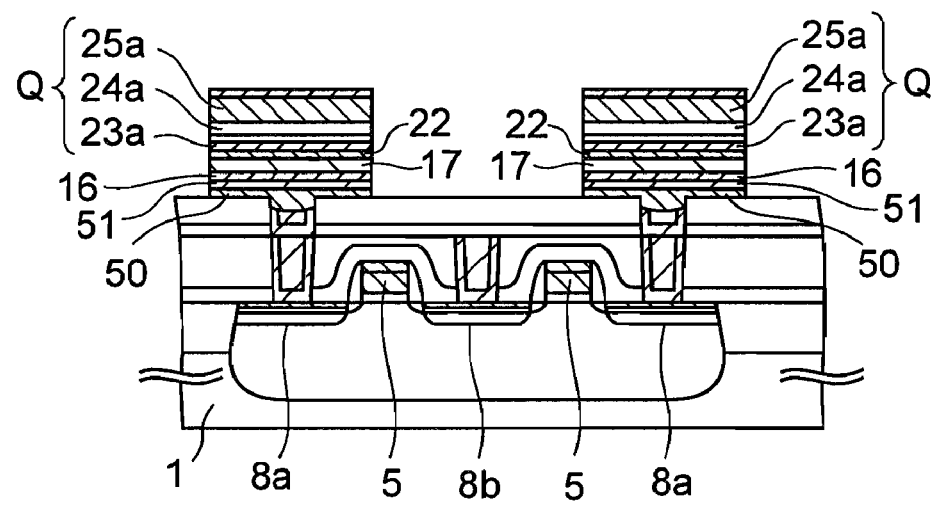

Next, processes to be conducted prior to obtaining a cross-sectional structure shown in FIG. 7K will be described below.

First, the conductive anti-diffusion film 22, the conductive oxygen barrier film 17, the conductive adhesive film 16, the conductive adhesive film 51, and the planarization conductive film 50 are etched by using the first hard mask 26a as the mask so as to leave these films only below the capacitor Q. This etching process is conducted by dry etching, and the mixed gas of argon and chlorine is used as the etching gas, for example.

Moreover, since the first hard mask 26a is also etched by this etching gas, the first hard mask 26a is removed when the etching process is completed. Consequently, the upper surface of the upper electrode 25a is exposed.

Figure 7L:
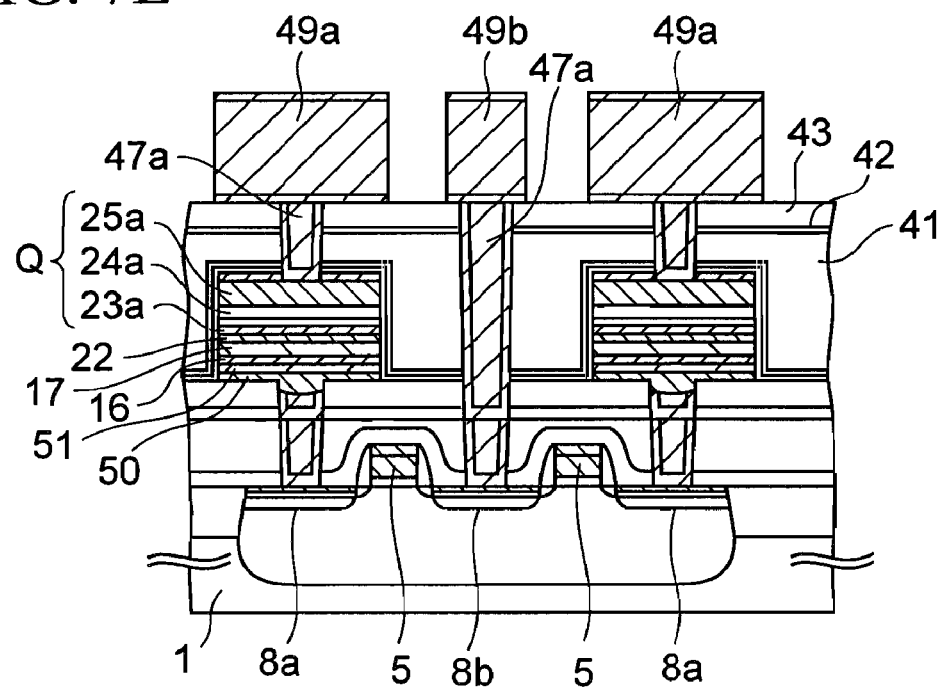

Thereafter, the basic structure of the semiconductor device of this embodiment is completed as shown in FIG. 7L by executing the processes described with reference to FIGS. 6R to 6X in the first embodiment.

According to this embodiment as described with reference to the FIG. 7C, the recesses 15b generated around the third conductive plugs 36a as a result of the CMP process are buried with the planarization conductive film 50, and the planarization conductive film 50 is further planarized by another CMP process.

In this way, the lower electrode 23a (see FIG. 7L) formed above the planarization conductive film 50 can achieve fine planarity, and the crystalline orientation of the lower electrode 23a is thereby improved. Moreover, the crystalline orientation of the capacitor dielectric film 24a is also improved by way of the improved crystalline orientation of the lower electrode 23a. Accordingly, the ferroelectric properties of the capacitor dielectric film 24a such as the switching charge amount are enhanced.

Moreover, the conductive anti-diffusion film 22 is disposed between the conductive oxygen barrier film 17 and the first conductive film 23 as in the case of the first embodiment. Accordingly, it is possible to prevent the diffusion of the lead atoms in the ferroelectric film 24 toward the conductive oxygen barrier film 17 due to the heat supplied at the time of forming the capacitor Q, and thereby the detachment or the expansion of the first conductive film 23 attributable to the chemical reaction between the lead and the conductive oxygen barrier film 17 is prevented.

(4) Third Embodiment

Figure 8:
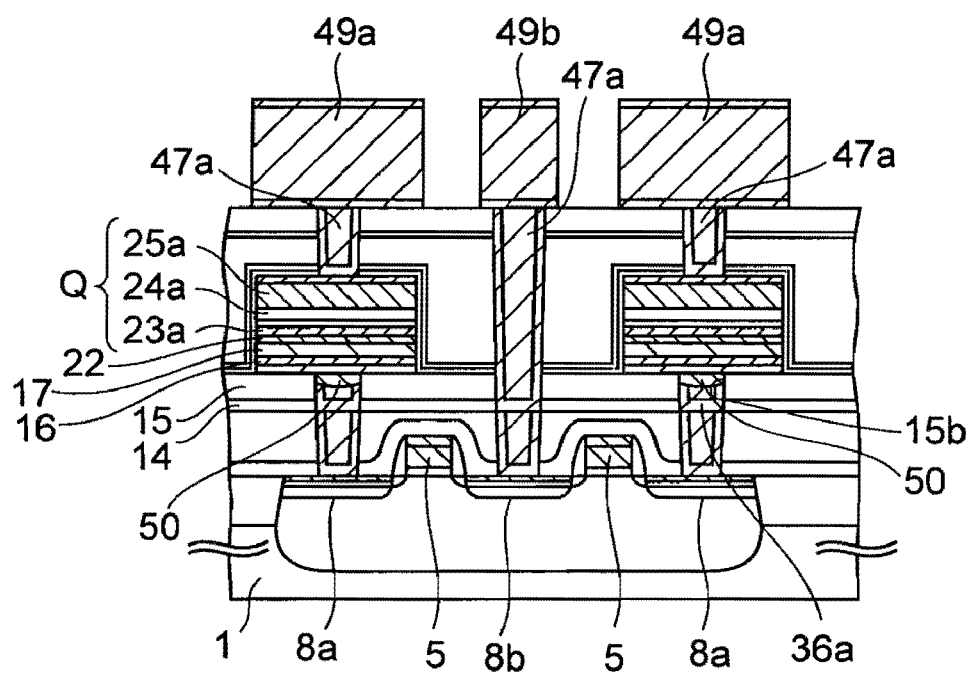
FIG. 8 is a cross-sectional view showing a semiconductor device according to a third embodiment of the present invention.

FIG. 8 is a cross-sectional view of a semiconductor device according to this embodiment.

This embodiment is different from the second embodiment in that the planarization conductive film 50 is partially removed from the upper surface of the underlying insulating film 15 in the CMP process shown in FIG. 7D so as to leave only the portion of the planarization conductive film 50 located on the third conductive plug 36a inside the recess 15b. Other features of this embodiment are the same as those in the second embodiment.

Even when the planarization conductive film 50 is completely removed from the upper surface of the underlying insulating film 15 by the CMP process in this manner, it is possible to reduce the over-polishing amount at the time of the CMP process since the planarization conductive film 50 has the small film thickness. Accordingly, a concave portion is hardly formed on the upper surface of the planarization conductive film 50 left inside the recess 15b. Thus, the upper surfaces of the planarization conductive film 50 and of the underlying insulating film 15 constitute the continuous flat surface. As a result, the crystallinity each of the lower electrode 23a and the capacitor dielectric film 24a becomes favorable.

In addition, the conductive anti-diffusion film 22 is formed below the lower electrode 23a in this embodiment as well. Accordingly, it is possible to prevent the detachment or the expansion of the lower electrode 23a caused by the thermal diffusion of the lead atoms from the capacitor dielectric film 24a made of PZT toward the conductive oxygen barrier film 17.

(5) Fourth Embodiment

Figure 9A:
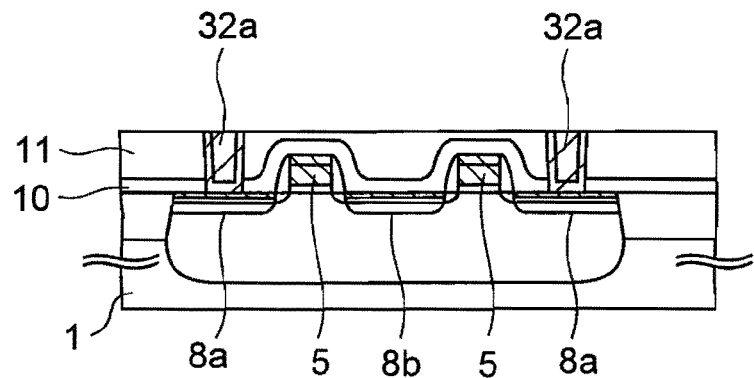
FIGS. 9A to 9Q are cross-sectional views showing states in the course of manufacturing a semiconductor device according to a fourth embodiment of the present invention.
Figure 9B:
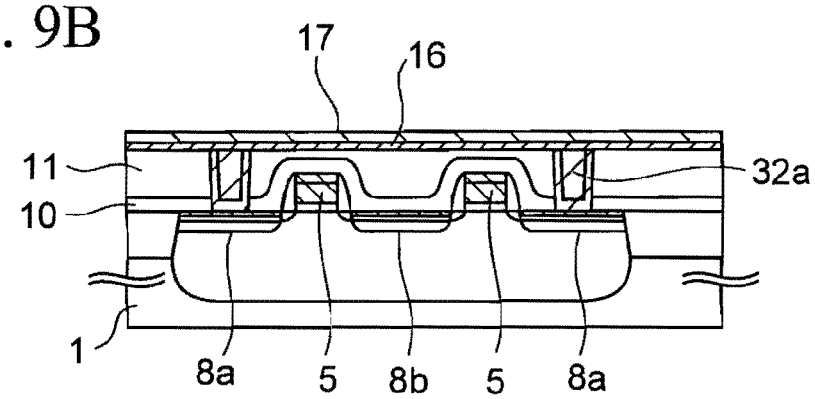
Figure 9C:
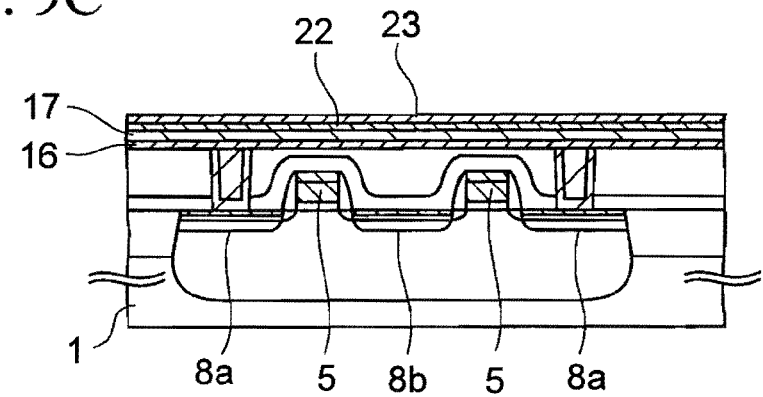
Figure 9D:
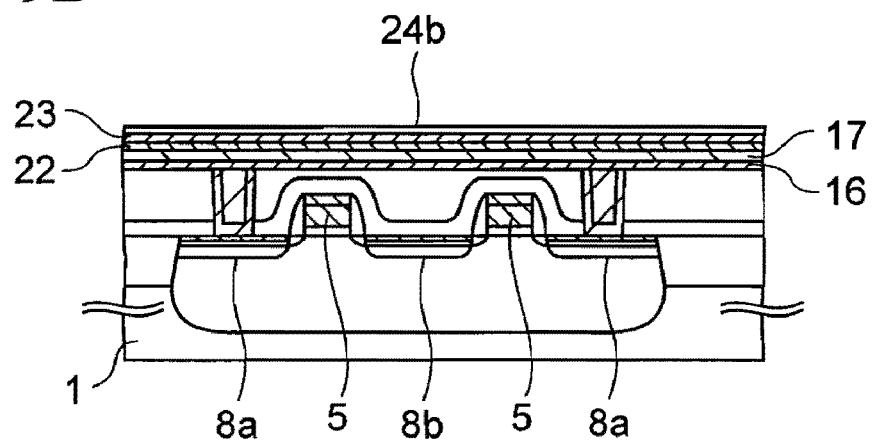
Figure 9E:
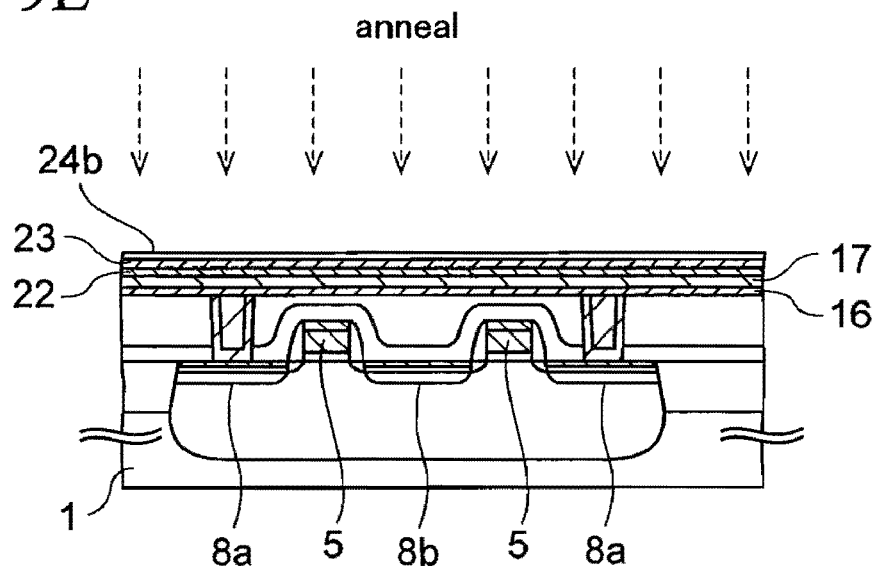
Figure 9F:
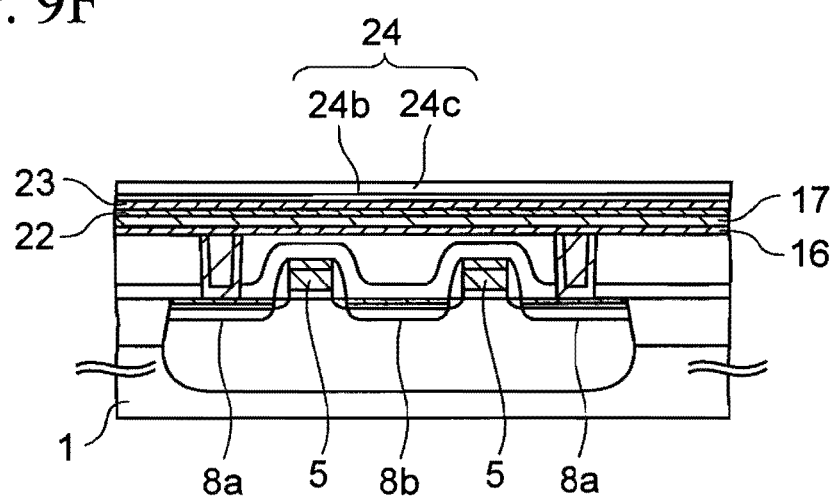
Figure 9G:
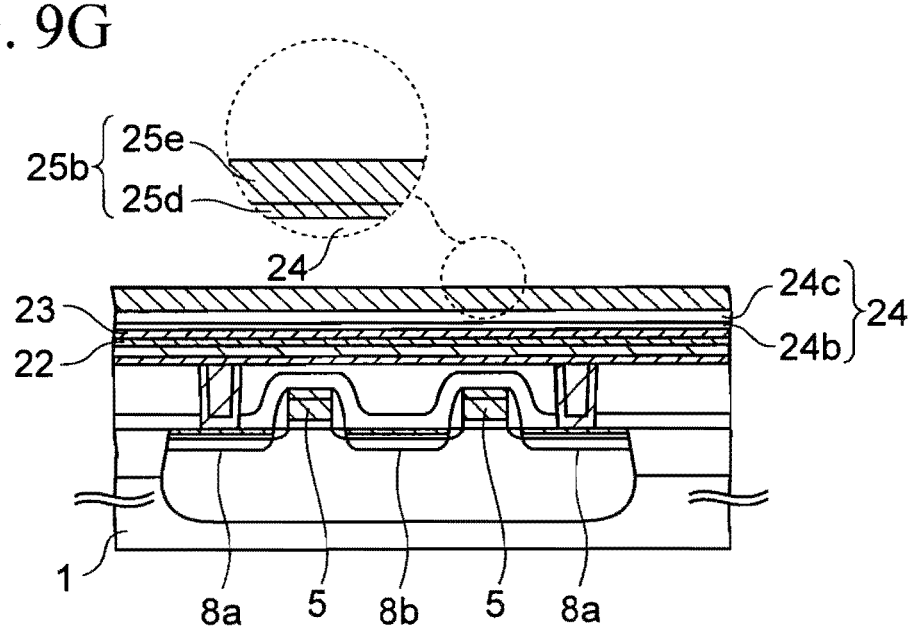
Figure 9H:
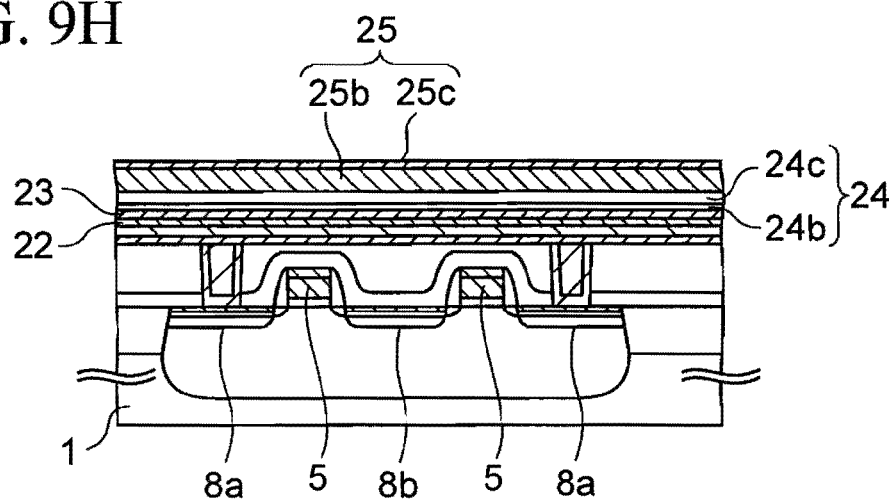
Figure 9I:
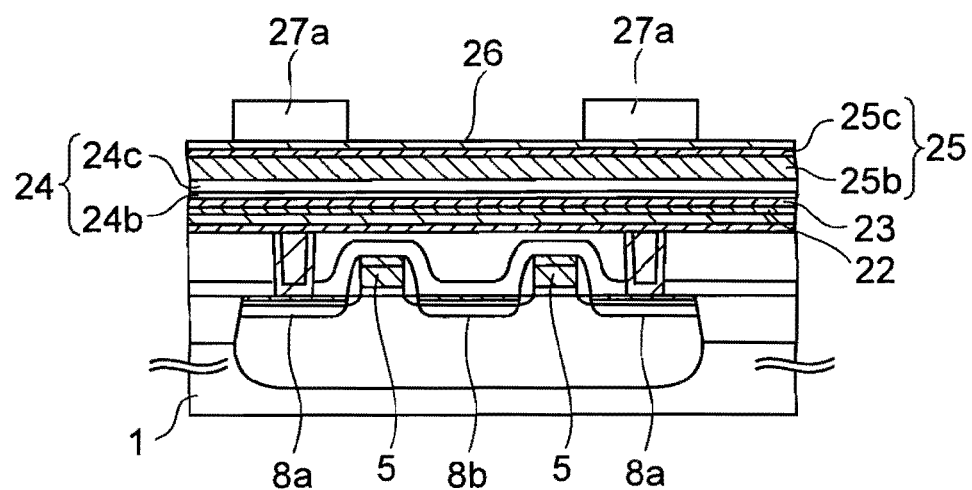
Figure 9J:
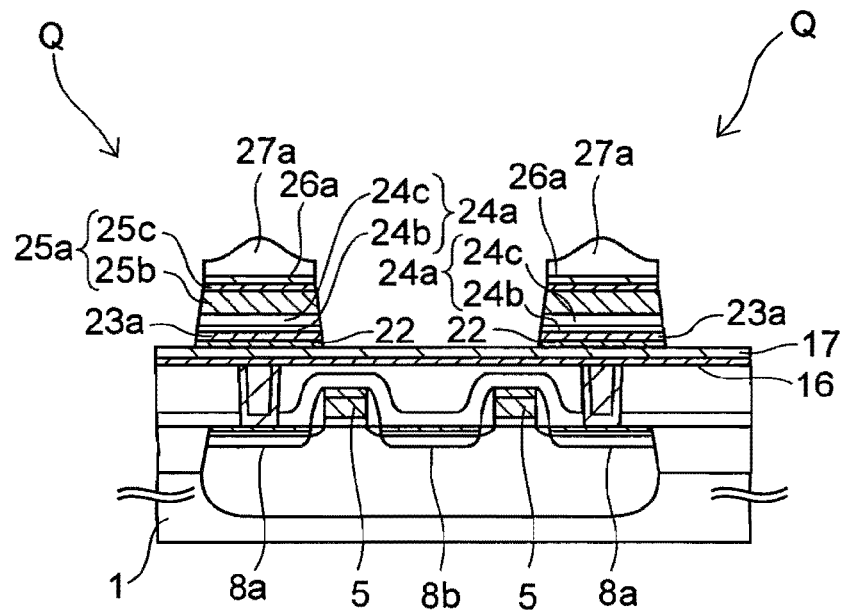
Figure 9K:
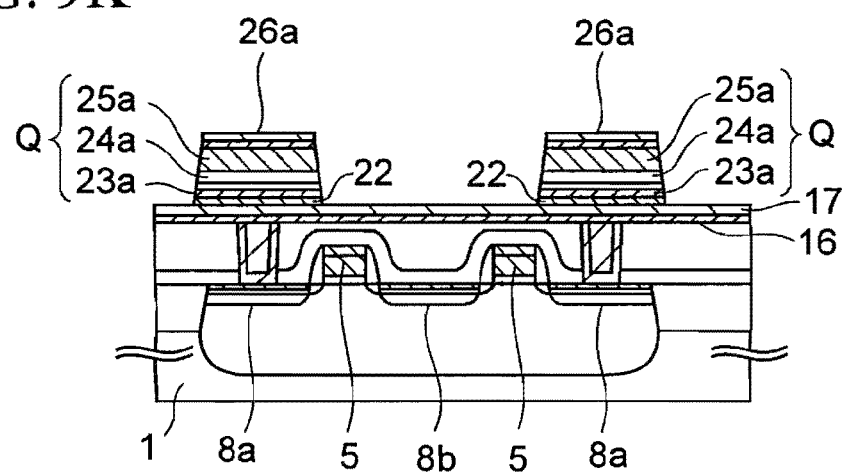
Figure 9L:
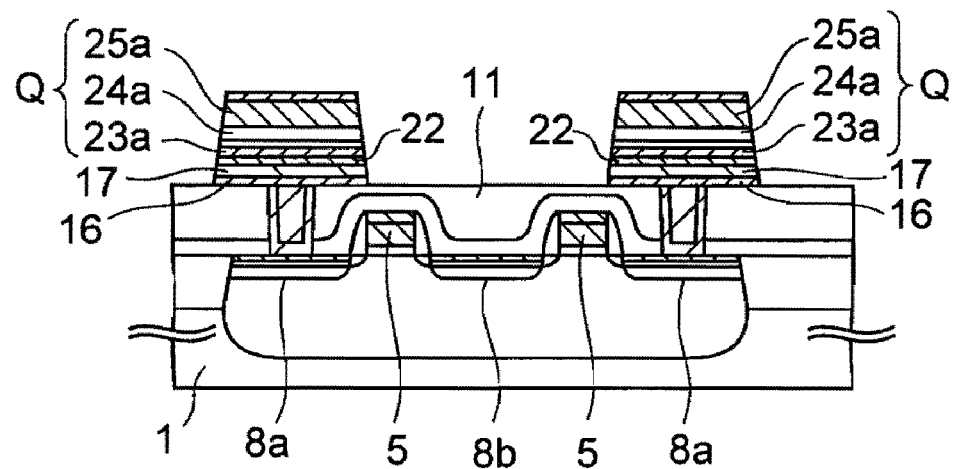
Figure 9M:
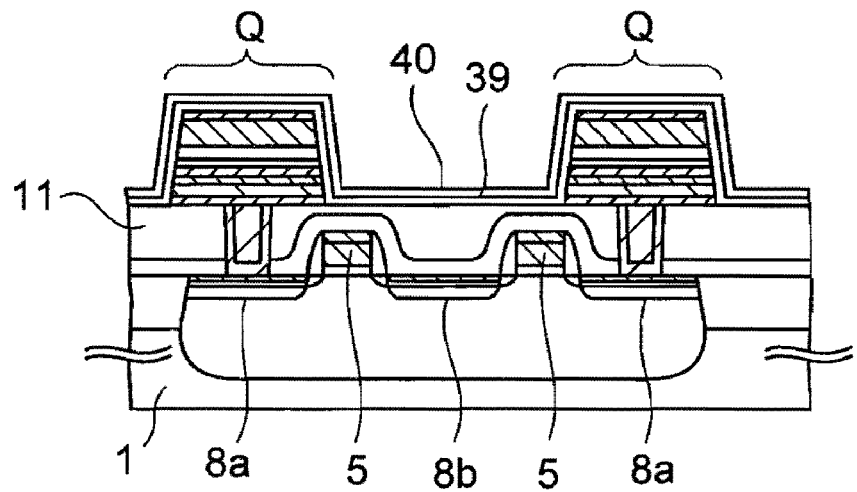
Figure 9N:
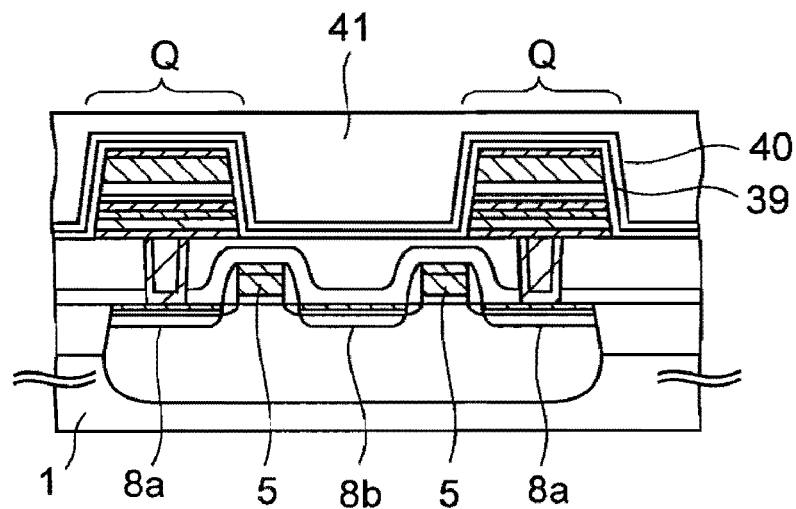
Figure 9O:
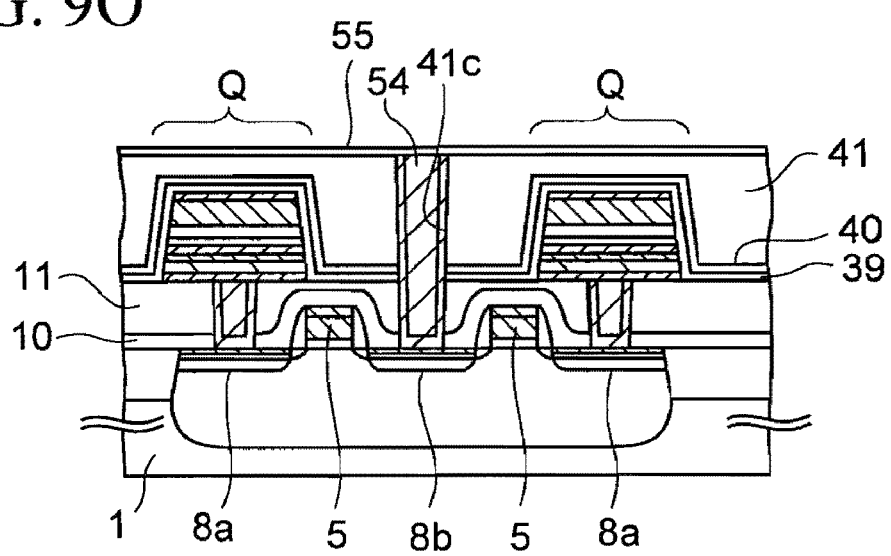
Figure 9P:
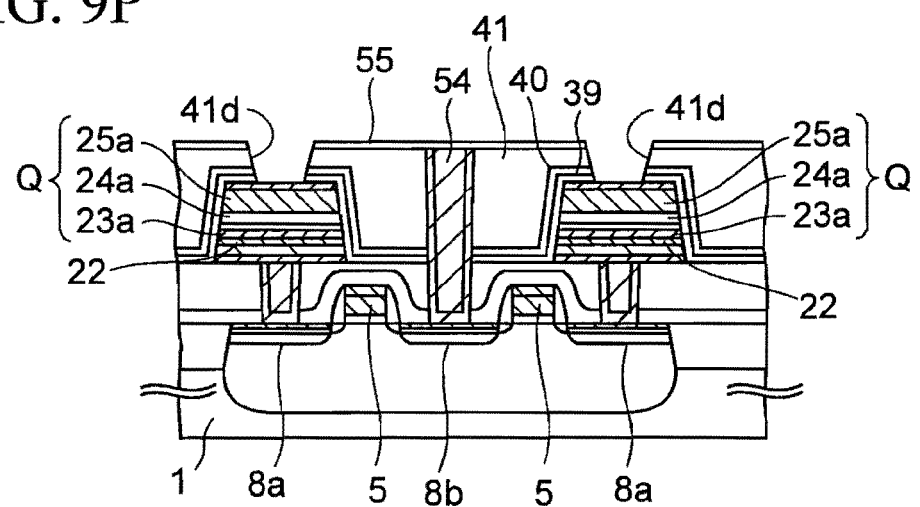
Figure 9Q:
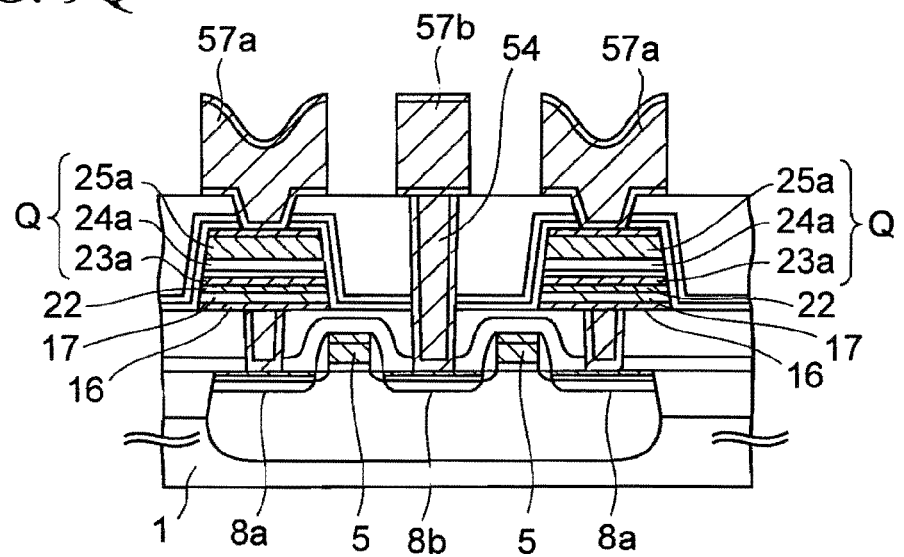

FIGS. 9A to 9Q are cross-sectional views showing states in the course of manufacturing a semiconductor device according to this embodiment. In the drawings, the constituents described in the first embodiment are indicated with the same reference numerals as those in the first embodiment, and the explanations thereof will be omitted hereinafter.

In the beginning, processes to be conducted prior to obtaining a cross-sectional structure shown in FIG. 9A will be described below.

First, the cover insulating film 10 and the first interlayer insulating film 11 are formed on the silicon substrate 1 in accordance with the steps described in the first embodiment with reference to FIG. 6A. Then, contact holes are formed above the first source/drain regions 8a by patterning these insulating films.

Moreover, the glue film and the tungsten film are sequentially formed inside the contact hole, and thereafter the excessive glue film and the excessive tungsten film on the first interlayer insulating film 11 are polished and removed by the CMP method. These films are left only inside the contact hole as the first conductive plug 32a.

Next, a titanium film is formed with a thickness of about 20 nm on each of the first interlayer insulating film 11 and the first conductive plug 32a as shown in FIG. 9B. This titanium film is formed as the conductive adhesive film 16.

Note that, it is also possible to execute the ammonia plasma process in advance on the upper surfaces of the first interlayer insulating film 11 and of the first conductive plugs 32a before this conductive adhesive film 16 is formed. By executing the ammonia plasma process, the titanium atoms deposited on the first interlayer insulating film 11 are hardly captured by the oxygen atoms on the surface of the insulating film 11. Accordingly, the titanium atoms can move freely on the surface of the first interlayer insulating film 11, and it is therefore possible to form the conductive adhesive film 16 made of titanium which is highly self-organized in the (002) direction.

Thereafter, the conductive adhesive film 16 is subjected to RTA in a nitrogen atmosphere at a substrate temperature of 650° C. for a processing period of 60 seconds. In this way, the conductive adhesive film 16 made of the titanium is nitrogenized, whereby the conductive adhesive film 16 is formed of the titanium nitride which is oriented in the (111) direction.

Moreover, a titanium aluminum nitride film functioning as the conductive oxygen barrier film 17 is formed with a thickness of 100 nm on this conductive adhesive film 16 by the reactive sputtering method.

Next, processes to be conducted prior to obtaining a cross-sectional structure shown in FIG. 9C will be described below.

First, a titanium film is formed with a thickness of about 50 nm on the conductive oxygen barrier film 17 by the sputtering method while the film formation conditions identical to those of the first embodiment is adopted. This titanium film is formed as the conductive anti-diffusion film 22.

Moreover, the titanium in the conductive anti-diffusion film 22 is nitrogenized by executing the RTA process in the nitrogen atmosphere, thereby the conductive anti-diffusion film 22 made of the titanium nitride is oriented in the (111) direction. The RTA process is executed while the substrate temperature is set to 650° C., for example.

Subsequently, a platinum film serving as the first conductive film 23 is formed with a thickness of about 100 nm on this conductive anti-diffusion film 22 by the sputtering method.

Thereafter, the first conductive film 23 is subjected to RTA in the argon atmosphere for 60 seconds while the substrate temperature is set equal to or above 650° C. By performing this RTA process, the adhesion among the first conductive film 23, the conductive anti-diffusion film 22, and the conductive oxygen barrier film 17 is enhanced, and the crystallinity of the first conductive film 23 is also improved.

Subsequently, as shown in FIG. 9D, a thin PZT film serving as the first ferroelectric film 24b is formed with a thickness ranging from about 1 nm to 50 nm on the first conductive film 23 by the sputtering method. Note that it is possible to form the first ferroelectric film 24b by the sol-gel method instead.

Here, it is also possible to add any of lanthanum, calcium, strontium, and niobium to the PZT that constitutes the first ferroelectric film 24b in order to improve the electrical characteristics of the first ferroelectric film 24b.

Moreover, the material of the first ferroelectric film 24b is not limited only to PZT. It is possible to form the first ferroelectric film 24b by use of the ferroelectric material having an $ABO_3$-type perovskite structure (in which A is any one selected from the group consisting of Bi, Pb, Ba, Sr, Ca, Na, K and any of rare earth elements, and B is any one selected from the group consisting of Ti, Zr, Nb, Ta, W, Mn, Fe, Co and Cr) such as BLT.

In addition, Bi layer structure compounds such as $(Bi_{1-x}R_x)Ti_3O_{12}$ (in which R is a rare earth element and $0<x<1$), $SrBi_2Ta_2O_9$ (SBT), $SrBi_4Ti_4O_{15}$ and the like are usable as the constituent material of the first ferroelectric film 24b since these substances have the $ABO_3$-type perovskite structure when seen as one unit of crystal.

Here, the first ferroelectric film 24b formed by the sputtering method or the sol-gel method is not crystallized at the time of film formation.

Accordingly, in the next step, the first ferroelectric film 24b is subjected to crystallization annealing as shown in FIG. 9E, whereby the PZT in the first ferroelectric film 24b is crystallized and oriented in the (111) direction. Note that, the conditions for this crystallization annealing process are the same as the conditions described with reference to FIG. 6I in the first embodiment, and the explanation thereof will be omitted herein.

Subsequently, as shown in FIG. 9F, a PZT film is formed with a thickness of about 80 nm on the first ferroelectric film 24b by the MOCVD method. The PZT film is formed as the second ferroelectric film 24c. As the conditions for forming the second ferroelectric film 24c, the conditions described with reference to FIG. 6J in the first embodiment may be adopted for an example.

The ferroelectric films 24b and 24c thus formed collectively constitute the ferroelectric film 24.

Subsequently, as show in FIG. 9G, the first conductive metal oxide film 25d and the second conductive metal oxide film 25e which are made of iridium oxide are formed on the ferroelectric film 24 by executing the processes described with reference to FIG. 6K in the first embodiment. These films collectively constitute the conductive metal oxide film 25b.

Moreover, as shown in FIG. 9H, an iridium film serving as the conductivity enhancing film 25c is formed with a thickness ranging from 50 nm to 100 nm on the conductive metal oxide film 25b by the sputtering method, while the film formation conditions identical to those of the first embodiment are used.

Then, the conductivity enhancing film 25c and the conductive metal oxide film 25b collectively constitute the second conductive film 25.

Next, as shown in FIG. 9I, the first mask material layer 26 made of titanium nitride is formed on the second conductive film 25 by the sputtering method.

Moreover, the second hard mask 27a is formed by forming a silicon oxide film on the first mask material layer 26 by the plasma CVD method using TEOS gas, and then patterning the silicon oxide film.

Subsequently, as shown in FIG. 9J, the first hard mask 26a is formed by etching the first mask material layer 26 while using the second hard mask 27a as the mask.

Next, the portions of the second conductive film 25, the ferroelectric film 24, the first conductive film 23, and the conductive anti-diffusion film 22 not covered with the first and second hard masks 26a and 27a are subjected to dry etching. In this way, the capacitor Q including the lower electrode 23a, the capacitor dielectric film 24a, and the upper electrode 25a is formed, and the conductive anti-diffusion film 22 is left in an island shape below the lower electrode 23a.

Note that, the conditions for this dry etching process are described with reference to FIG. 6O in the first embodiment, and the explanation thereof will be omitted herein.

Meanwhile, the conductive oxygen barrier film 17 is not etched by the above-described dry etching process, and consequently remains on the entire surface of the conductive adhesive film 16.

Next, as shown in FIG. 9K, the second hard mask 27a is removed by wet etching or dry etching. In the case of wet etching, the mixed solution of hydrogen peroxide, ammonia, and water is used as the etching solution.

Subsequently, processes to be conducted prior to obtaining a cross-sectional structure shown in FIG. 9L will be described below.

First, the conductive adhesive film 16 and the conductive oxygen barrier film 17 are subjected to dry etching by use of the first hard mask 26a as the mask and the mixed gas of argon and chlorine as the etching gas so as to leave these films only below the capacitor Q.

Note that, since the first hard mask 26a is also etched by this etching gas, the first hard mask 26a is removed when the etching process is completed, and consequently the upper surface of the upper electrode 25a is exposed.

Subsequently, as shown in FIG. 9M, an alumina film serving as the first capacitor protection insulating film 39 is formed with a thickness of about 20 nm on the entire upper surface of the silicon substrate 1 so as to protect the capacitor Q against reductive substances such as hydrogen.

Then, in order to allow the capacitor dielectric film 24a to recover from the damages caused by dry etching (see FIG. 9J) for forming the capacitor Q and by the sputtering method at the time of forming the first capacitor protection insulation film 39, the capacitor dielectric film 24a is subjected to recovery annealing in an oxygen-containing atmosphere. As to the conditions for this recovery annealing process, the substrate temperature in the furnace is set in a range from 550° C. to 700° C., for example 650° C., and the annealing process is continued for about 60 minutes.

Thereafter, another alumina film is formed with a thickness of about 20 nm on the first capacitor protection insulating film 39 by the CVD method. This alumina film is formed as the second capacitor protection insulating film 40.

Subsequently, as shown in FIG. 9N, a silicon oxide film serving as the second interlayer insulating film 41 is formed on the second capacitor protection insulating film 40 by the plasma CVD method using the TEOS gas as the reactive gas. The reactive gas also contains oxygen gas and helium gas. The second interlayer insulating film 41 has a thickness of 1500 nm on the flat surface of the silicon substrate 1.

Note that, it is also possible to form an inorganic insulating film as the second interlayer insulating film 41 instead of the silicon oxide film.

Thereafter, the surface of the second interlayer insulating film 41 is polished and planarized by the CMP method.

Next, processes to be conducted prior to obtaining a cross-sectional structure shown in FIG. 9O will be described below.

First, the surface of the second interlayer insulating film 41 is exposed to $N_2O$ plasma to remove the moisture remaining inside the second interlayer insulating film 41, and to prevent the second interlayer insulating film 41 from reabsorbing moisture.

Note that, it is also possible to carry out the $N_2$ plasma process as the dehydrating process.

Subsequently, the cover insulating film 10, the first and second interlayer insulating films 11 and 41, and the first and second capacitor protection insulating films 39 and 40 are patterned to form a first hole 41c through these insulating films located above the second source/drain region 8b.

Then, a glue film and a tungsten film are sequentially formed inside this first hole 41c, and thereafter the excessive portions of the glue film and the tungsten film on the second interlayer insulating film 41 is polished and removed by the CMP method. Consequently, these films are left only inside the first hole 41c collectively as a second conductive plug 54.

The second conductive plug 54 constitutes part of a bit line, and is electrically connected to the second source/drain region 8b.

Incidentally, the second conductive plug 54 mainly contains tungsten which is susceptible to oxidation, and consequently is apt to cause a contact defect if tungsten is oxidized during the process.

To deal with this problem, a silicon oxynitride film is formed with a thickness of about 100 nm on the upper surfaces of the second interlayer insulating film 41 and the second conductive plug 54 to prevent the oxidation of the second conductive plug 54. This silicon oxynitride film is formed as an antioxidant insulating film 55.

Next, as shown in FIG. 9P, the first and second capacitor protection insulating films 39 and 40, the second interlayer insulating film 41, and the antioxidant insulating film 55 are patterned to form a second hole 41d through these insulating films located above the upper electrode 25a.

After forming the second hole 41d, it is also possible to execute the annealing process in an oxygen-containing atmosphere so as to allow the capacitor dielectric film 24a to recover from the damages caused by the precedent processes. Even when such an annealing process is executed, the oxidation of the second conductive plug 54 is prevented by the antioxidant insulating film 55.

Thereafter, the antioxidant insulating film 55 is etched back and removed.

Subsequently, as shown in FIG. 9Q, a metal laminated film is formed on the upper surfaces of the second interlayer insulating film 41 and the second conductive plug 54 by the sputtering method. A metal interconnect 57a and a bit-line conductive pad 57b are formed by patterning this metal laminated film.

The metal laminated film is formed by stacking, for example, a titanium film with a thickness of 60 nm, a titanium nitride film with a thickness of 30 nm, a copper-containing aluminum film with a thickness of 400 nm, another titanium film with a thickness of 5 nm, and another titanium nitride film with a thickness of 70 nm in this order.

In this way, the basic structure of the semiconductor device of this embodiment is completed.

According to the above-described embodiment, it is possible to simplify the processes as compared to the first embodiment because the third conductive plugs 36a and the underlying insulating film 15 are not formed unlike the first embodiment.

Moreover, the second conductive plug 54 constituting the part of the bit line above the second source/drain region 8b has only single stage. This is a simpler structure than that of the first embodiment in which two stages of the conductive plugs 32b and 47b are formed.

In addition, the conductive anti-diffusion film 22 is disposed between the lower electrode 23a and the conductive oxygen barrier film 17 as in the case of the first embodiment. Accordingly, it is possible to prevent the thermal diffusion of the lead atoms in the capacitor dielectric film 24a by the conductive anti-diffusion film 22 when forming the capacitor Q, and thereby the detachment or the expansion of the lower electrode 23a attributable to the chemical reaction is prevented between the lead and the conductive oxygen barrier film 17.

As described above, according to the present invention, the conductive anti-diffusion film is disposed between the lower electrode and the conductive oxygen barrier film. It is, therefore, possible to prevent the thermal diffusion of the constituent element of the capacitor dielectric film by use of the conductive anti-diffusion film. In this way, it is possible to prevent the detachment of the lower electrode attributable to the chemical reaction with the constituent element, and thereby the semiconductor device including the highly reliable capacitor is provided.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for manufacturing a semiconductor device comprising:
   forming a first impurity diffusion region in a semiconductor substrate;
   forming a first interlayer insulating film over the semiconductor substrate;
   forming a first hole in the first interlayer insulating film;
   forming, a plug conductive film in the first hole, to form a first conductive plug electrically connected to the first impurity diffusion region;
   forming a conductive oxygen barrier film on each of the first interlayer insulating film and the first conductive plug;
   forming a conductive anti-diffusion film above the conductive oxygen barrier film;
   forming, above the conductive anti-diffusion film, a first conductive film;
   forming a ferroelectric film on the first conductive film;
   forming a second conductive film on the ferroelectric film;
   patterning the conductive anti-diffusion film, the first conductive film, the ferroelectric film and second conductive film; and
   removing the region of the conductive oxygen barrier film uncovered with the patterned first conductive film,
   wherein a film made of a non-oxide conductive material for preventing the diffusion of a constituent element of the ferroelectric film is formed as the conductive anti-diffusion film.

2. The method for manufacturing a semiconductor device according to claim 1,
   wherein the process of forming the ferroelectric film comprises:
   forming a first ferroelectric film on the first conductive film by any of a sputtering method and a sol-gel method;
   annealing and crystallizing the first ferroelectric film;
   forming a second ferroelectric film on the first ferroelectric film by a metal-organic chemical vapor deposition method.

3. The method for manufacturing a semiconductor device according to claim 2,
   wherein, in the process of forming the second ferroelectric film, the semiconductor substrate is heated in an oxygen-containing atmosphere, and then the second ferroelectric film is formed in a raw material gas atmosphere.

4. The method for manufacturing a semiconductor device according to claim 3,
   wherein the first ferroelectric film is exposed to a solvent gas atmosphere after the semiconductor substrate is heated and before the second ferroelectric film is formed.

5. The method for manufacturing a semiconductor device according to claim 4,
   wherein a film having an $ABO_3$-type perovskite structure is formed as the capacitor dielectric film, in which A is any one selected from the group consisting of Bi, Pb, Ba, Sr, Ca, Na, K and any of rare earth elements, and in which B is any one selected from the group consisting of Ti, Zr, Nb, Ta, W, Mn, Fe, Co and Cr, and
   a film for preventing the diffusion of an element from the A site of the capacitor dielectric film is formed as the conductive anti-diffusion film.

6. The method for manufacturing a semiconductor device according to claim 1,
   wherein the process of forming the second conductive film comprises:
   forming a first conductive metal oxide film on the ferroelectric film;
   annealing the first conductive metal oxide film;

forming, on the first conductive metal oxide film, a second conductive metal oxide film having a larger oxygen content than that of the first conductive metal oxide film after the annealing process.

7. The method for manufacturing a semiconductor device according to claim 1, further comprising:
 forming an underlying insulating film on the first interlayer insulating film and the first conductive plug;
 forming a second hole in the underlying insulating film located over the first conductive plug;
 forming, in the second hole, a second conductive plug electrically connected to the first conductive plug;
 forming a planarization conductive film on each of the second conductive plug and the underlying insulating film; and
 planarizing the planarization conductive film,
 wherein the conductive oxygen barrier film is formed on the planarized planarization conductive film in the process of forming the conductive oxygen barrier film.

8. The method for manufacturing a semiconductor device according to claim 7,
 wherein, in the process of planarizing the planarization conductive film, the planarization conductive film is left only on the second conductive plug by polishing the planarization conductive film.

9. The method for manufacturing a semiconductor device according to claim 1, further comprising:
 forming a second impurity diffusion region in the semiconductor substrate;
 forming a second interlayer insulating film covering the capacitor;
 forming a third hole in the first interlayer insulating film and the second interlayer insulating film located above the second impurity diffusion region; and
 forming, in the third hole, a third conductive plug electrically connected to the second impurity diffusion region.

* * * * *